(12) United States Patent
Fukada et al.

(10) Patent No.: US 9,121,875 B2
(45) Date of Patent: Sep. 1, 2015

(54) POTENTIAL MEASURING DEVICE

(71) Applicant: KOGANEI CORPORATION, Tokyo (JP)

(72) Inventors: Yoshinari Fukada, Koganei (JP); Fumihito Meguro, Fuchu (JP)

(73) Assignee: KOGANEI CORPORATION (JP)

( * ) Notice: Subject to any disclaimer, the term of this patent is extended or adjusted under 35 U.S.C. 154(b) by 319 days.

(21) Appl. No.: 13/867,303

(22) Filed: Apr. 22, 2013

(65) Prior Publication Data

US 2013/0307553 A1    Nov. 21, 2013

(30) Foreign Application Priority Data

Apr. 23, 2012    (JP) .................................. 2012-098095

(51) Int. Cl.
*G01R 29/12*        (2006.01)

(52) U.S. Cl.
CPC ...................................... *G01R 29/12* (2013.01)

(58) Field of Classification Search
CPC ...................................... G01R 29/12
USPC .......... 324/458, 754.23, 754.22, 762.03, 251, 324/175; 382/132, 145; 430/30, 494
See application file for complete search history.

(56) References Cited

U.S. PATENT DOCUMENTS

| | | | |
|---|---|---|---|
| 6,014,028 A | 1/2000 | Ohashi et al. | |
| 6,177,800 B1 * | 1/2001 | Kubby et al. | ................. 324/458 |
| 8,022,597 B2 | 9/2011 | Suzuki | |
| 8,080,906 B2 | 12/2011 | Roberts et al. | |
| 2008/0278008 A1 | 11/2008 | Roberts et al. | |
| 2010/0109476 A1 | 5/2010 | Suzuki | |
| 2013/0307554 A1 * | 11/2013 | Fukada | .......................... 324/458 |

FOREIGN PATENT DOCUMENTS

| | | |
|---|---|---|
| JP | 5389782 A | 8/1978 |
| JP | 5911816 U | 1/1984 |
| JP | 61139439 U | 8/1986 |
| JP | 6273238 U | 5/1987 |

(Continued)

OTHER PUBLICATIONS

Notice of Reasons for Rejection corresponding to Application No. JP2012-098095; Date of Mailing: Apr. 21, 2015, with English abstract.

(Continued)

*Primary Examiner* — Arleen M Vazquez
*Assistant Examiner* — Robert P Alejnikov, Jr.
(74) *Attorney, Agent, or Firm* — Cantor Colburn LLP

(57) ABSTRACT

There is provided a potential measuring device of non-contact type which can improve measurement sensitivity. A potential measuring device which measures a charged object in a non-contact manner with a sensor includes: a first shutter and a second shutter each having a shutter part provided with an opening and a leaf spring part; a magnet attached to the leaf spring part of each of the first shutter and the second shutter; a yoke on which a coil is disposed, the coil applying an alternating magnetic field to the magnet of each of the first shutter and the second shutter to cause the shutter part to reciprocate via the leaf spring part; and a natural frequency adjusting means for adjusting a natural frequency of at least one of a first shutter system including the first shutter and the magnet and a second shutter system including the second shutter and the magnet.

8 Claims, 19 Drawing Sheets

(56) References Cited

FOREIGN PATENT DOCUMENTS

| | | |
|---|---|---|
| JP | H03241850 A | 10/1991 |
| JP | H08271562 A | 10/1996 |
| JP | H09281167 A | 10/1997 |
| JP | H09325067 A | 12/1997 |
| JP | 10-115647 A | 5/1998 |
| JP | 2007051885 A | 3/2007 |
| JP | 2007218693 A | 8/2007 |
| JP | 2008536469 A | 9/2008 |
| JP | 2009151013 A | 7/2009 |
| WO | 2008126232 A1 | 10/2008 |

OTHER PUBLICATIONS

Notice of Reasons for Rejection corresponding to Application No. JP2012-098095; Date of Mailing: Jul. 7, 2015, with English abstract.

* cited by examiner

POTENTIAL MEASURING DEVICE

CROSS REFERENCE TO RELATED APPLICATIONS

The present invention claims priority under 35 U.S.C. §119 to Japanese Application No. 2012-098095 filed Apr. 23, 2012, the entire content of which is incorporated herein by reference.

BACKGROUND OF THE INVENTION

1. Field of the Invention

The present invention relates to a potential measuring device which measures a surface potential of a charged object in a non-contact manner.

2. Description of the Related Art

To measure a surface potential of a charged object which is charged with an electric charge, a potential measuring device of non-contact type is used, with which measurement is performed under the condition that a measuring element is not contacted with the charged object. Among such potential measuring devices, there is one described in Patent Document 1 for example. The potential measuring device of the type described in Patent Document 1 includes a pair of vibrating pieces, an electromagnetic coil, and a piezoelectric element. A chopper electrode is provided on a tip side of the pair of vibrating pieces, and this chopper electrode is located between the charged object and a detecting electrode. Then, when the pair of vibrating pieces is vibrated by operation of the electromagnetic coil and the piezoelectric element, the chopper electrode changes electric flux lines between the charged object and the detecting electrode. Thus, an alternating voltage is generated on the detecting electrode, to thereby enable measurement of the surface potential.

[Patent Document 1] Japanese Patent Application Laid-open No. H10-115647

In the potential measuring device of the type described in Patent Document 1, the electromagnetic coil is often attached in close vicinity to one of the pair of vibrating pieces, for example. In this case, there is created a state that respective natural frequencies of the vibrating pieces do not match. In such a state that the natural frequencies of the vibrating pieces do not match, the amplitude of the chopper electrode cannot be made large, and thus good sensitivity cannot be obtained.

The present invention is made based on the above-described situation, and an object thereof is to provide a potential measuring device of non-contact type which has higher measurement sensitivity than conventional ones.

SUMMARY OF THE INVENTION

To solve the above-described problem, according to a first aspect of the present invention, there is provided a potential measuring device which measures a surface potential of a charged object in a non-contact manner with a sensor disposed to oppose the charged object, the device including: a first shutter and a second shutter each having a shutter part, which is disposed between the charged object and the sensor and has an opening, and a leaf spring part extending from the two shutter parts; a magnet attached to the leaf spring part of each of the first shutter and the second shutter; a yoke on which a coil is disposed, the coil applying an alternating magnetic field to the magnet of each of the first shutter and the second shutter to cause the shutter part to reciprocate via the leaf spring part; and a natural frequency adjusting means for adjusting a natural frequency of at least one of a first shutter system including the first shutter and the magnet attached to the first shutter and a second shutter system including the second shutter and the magnet attached to the second shutter.

Further, in the above-described invention, the natural frequency adjusting means may include an adjusting back yoke disposed on an opposite side of a side of the leaf spring part that opposes the yoke and adjusting a magnetic force between the adjusting back yoke and the magnet, and a support means for supporting the adjusting back yoke.

Further, in the above-described invention, it may be structured such that the natural frequency adjusting means changes a distance between the magnet and the adjusting back yoke.

Further, in the above-described invention, it may be structured such that the natural frequency adjusting means changes an opposing area between the magnet and the adjusting back yoke.

Further, in the above-described invention, a thread part is formed in an outer periphery of the adjusting back yoke and a screw hole is formed in the support means, a magnetic force is adjusted between the adjusting back yoke and the magnet by adjusting a degree of screwing the thread part of the adjusting back yoke into the screw hole, and by this adjustment of magnetic force the natural frequency of at least one of the first shutter system and the second shutter system may be adjusted.

Further, in the above-described invention, it may be structured such that the support means is provided with a pivot member which is pivotable about a fulcrum, the adjusting back yoke is provided on a portion of the pivot member, which is far from the fulcrum, and the adjusting back yoke is provided to be capable of being positioned between a position where the adjusting back yoke opposes the magnet and a position where the adjusting back yoke does not oppose the magnet by pivoting the pivot member.

Further, in the above-described invention, the shutter part of the first shutter and the shutter part of the second shutter are disposed to oppose each other in an orthogonal direction which is orthogonal to a moving direction in which it is moved by operation of a coil, and in the opposing disposition, by moving the respective shutter parts of the first shutter and the second shutter by operation of the coil, the shutter parts may be capable of being positioned between an open state in which an opening area which is an overlap between the respective openings along the orthogonal direction becomes large and a closed state in which the opening area becomes smaller than in the opening state.

Further, in the above-described invention, a potential measuring device which measures a surface potential of a charged object in a non-contact manner with a sensor disposed to oppose the charged object may include: a first shutter and a second shutter each having a shutter part, which is disposed between the charged object and the sensor and has an opening, and a leaf spring part extending from both ends of each of the two shutter parts; a magnet attached to the leaf spring part of each of the first shutter and the second shutter; a yoke on which a coil is disposed, the coil applying an alternating magnetic field to the magnet of each of the first shutter and the second shutter to cause the shutter part to reciprocate via the leaf spring part; an adjusting back yoke disposed on an opposite side of a side of the leaf spring part that opposes the yoke and adjusting a magnetic force between the adjusting back yoke and the magnet; and a magnetic force adjusting means for adjusting a magnetic force between the adjusting back yoke and the magnet.

According to the present invention, it is possible to improve measurement sensitivity in a potential measuring device of non-contact type.

BRIEF DESCRIPTION OF THE DRAWINGS

FIG. 6b is a diagram schematically illustrating a positional relation of a magnetic circuit when vibrations occur as in FIG. 6a;

FIG. 8b is a diagram schematically illustrating a positional relation of the magnetic circuit when vibrations occur as in FIG. 8a;

FIG. 9b is a diagram schematically illustrating a positional relation of a magnetic circuit when vibrations occur as in FIG. 9a;

DETAILED DESCRIPTION OF THE PREFERRED EMBODIMENTS

First Embodiment

Hereinafter, a potential measuring device 10A according to a first embodiment of the present invention will be described based on the drawings. Note that in the following description, there may be cases where an XYZ orthogonal coordinate system is set for description. In this coordinate system, a direction in which shutter parts 44, 54 vibrate is defined as an X direction, a direction in which a first shutter 40A and a second shutter 50A line (forward and backward direction) is defined as a Y direction, and a direction orthogonal to these X direction and Y direction (direction from a base part 21 toward a sensor electrode 60; upward and downward direction) is defined as a Z direction.

<Regarding Structure of the Potential Measuring Device 10A>

Figure 1:
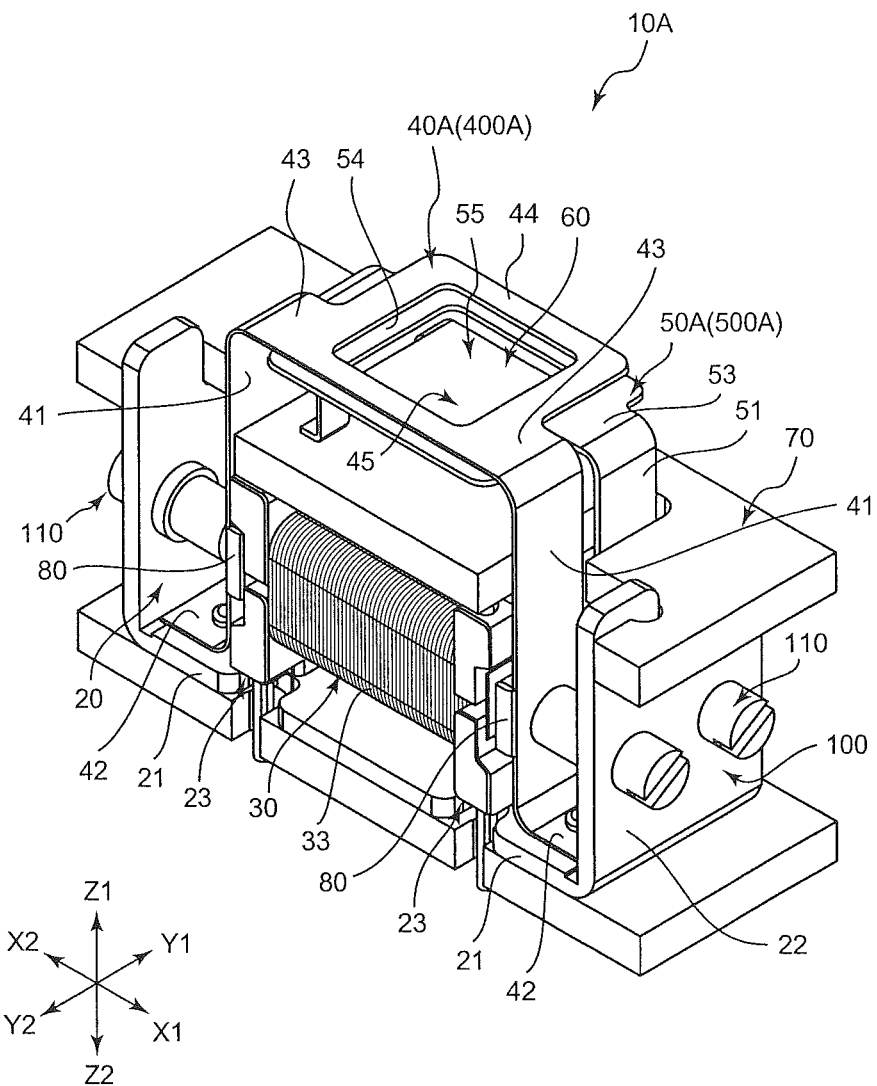
FIG. 1 is a perspective view illustrating a structure of a potential measuring device according to a first embodiment of the present invention.

As illustrated in FIG. 1, the potential measuring device 10A has a frame member 20, a coil unit 30, a first shutter 40A, a second shutter 50A, a sensor electrode 60, magnets 80, and a balance adjusting mechanism 100.

The frame member 20 is attached to, for example, a fixing region of a base plate or the like on which a driving circuit or the like is provided. To the frame member 20, the coil unit 30, the first shutter 40A, the second shutter 50A, and the balance adjusting mechanism 100 are attached. This frame member 20 is formed of a metal material which is larger in thickness than the first shutter 40A and the second shutter 50A, so as to have strength of the degree that it would not bend easily when electricity is conducted through a coil 33, which will be described later. Note that while an example of such a material is SUS304 or the like, any other metallic material or a non-metallic material such as ceramic or resin may be used.

Further, the frame member 20 has a base part 21 and rising parts 22. The base part 21 is a part attached to the aforementioned fixing region, and has a longitudinal side along the X direction illustrated in FIG. 1 and the like. Further, the rising parts 22 (corresponding to a support means) are a part extending along the Z direction from both end sides of the base part 21. Note that in this embodiment, the length of a rising part 22 (dimension along the Z direction) is provided to be shorter than the length (dimension along the X direction) of the base part 21.

Further, cutouts 23 are provided in the base part 21. The cutouts 23 are a part in which a binding pin 34 for binding an end of a winding wire of the coil 33 is positioned. Note that the number of cutouts 23 provided corresponds to the number of ends of winding wires of the coil 33.

Figure 2:
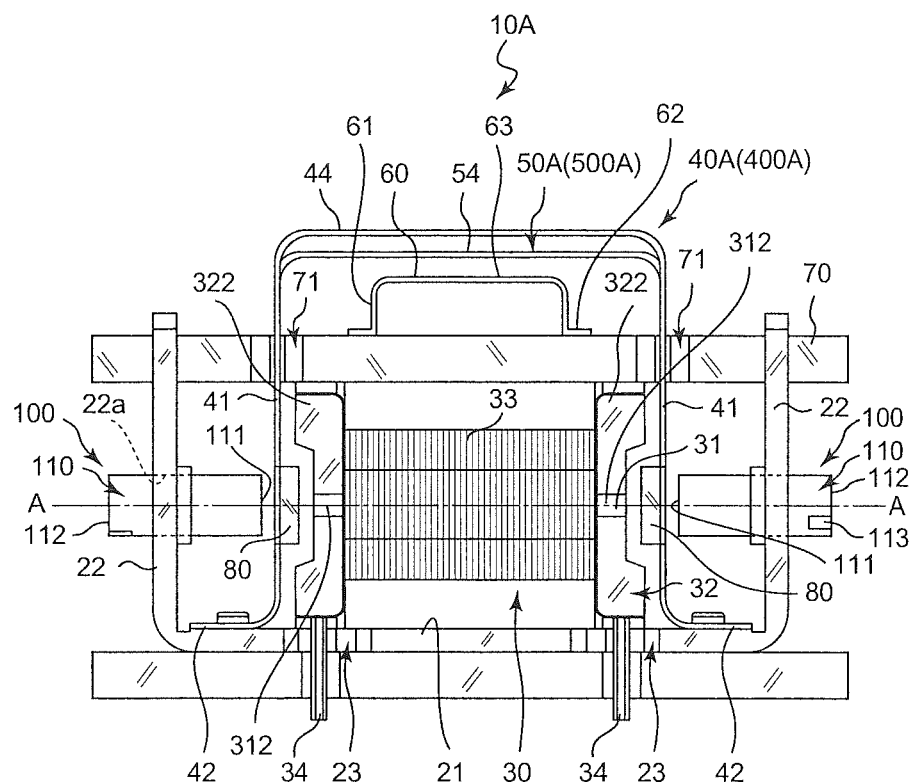
FIG. 2 is a side view of the potential measuring device of FIG. 1.
Figure 2:
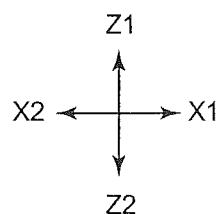
Figure 3:
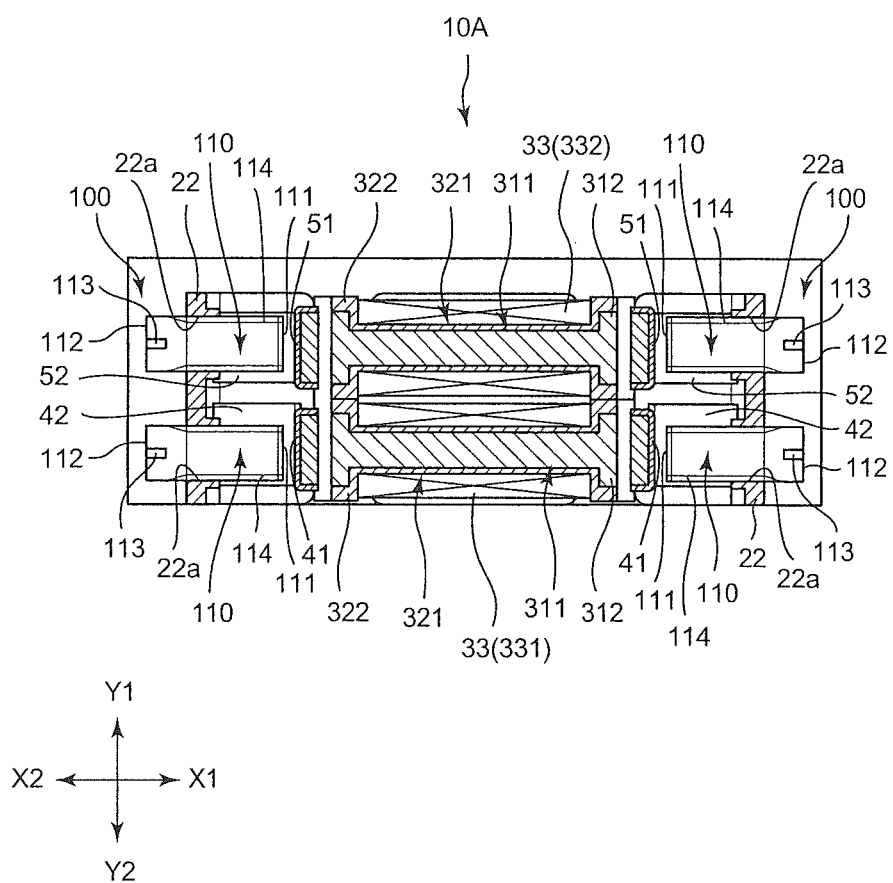
FIG. 3 is a cross-sectional view illustrating a state of cutting the potential measuring device along an A-A line of FIG. 2.
Figure 4:
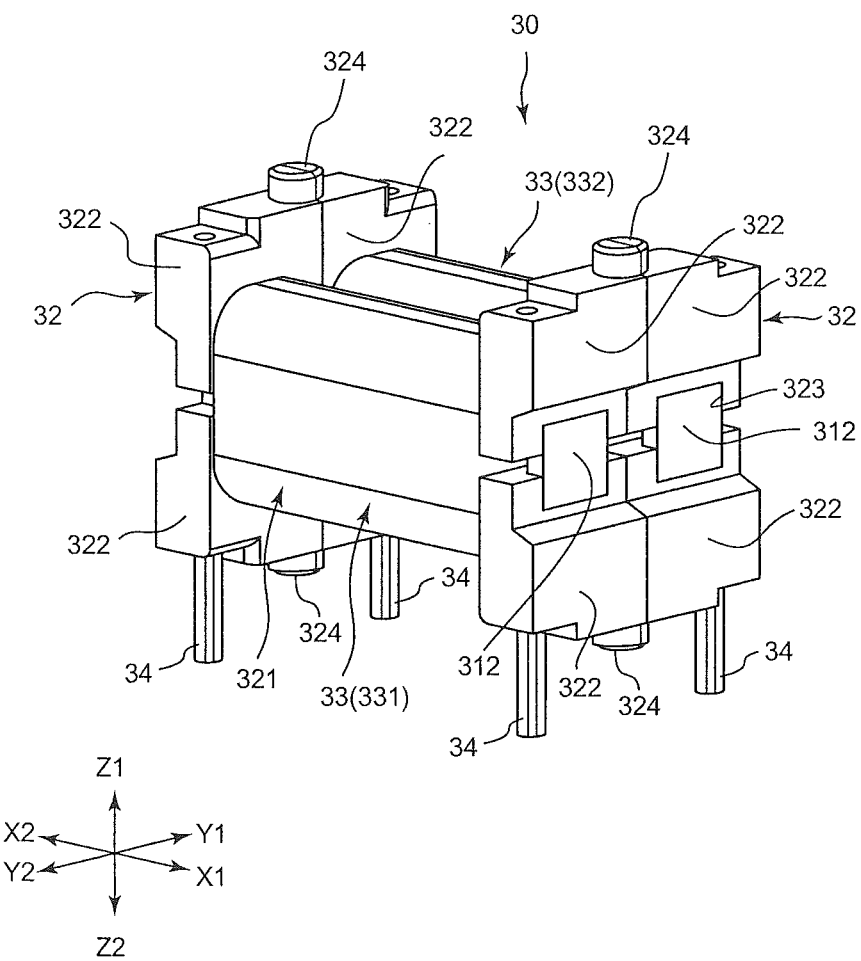
FIG. 4 is a perspective view illustrating a structure of a coil unit in the potential measuring device of FIG. 1 in a state that two coil units are disposed adjacently.
Figure 5:
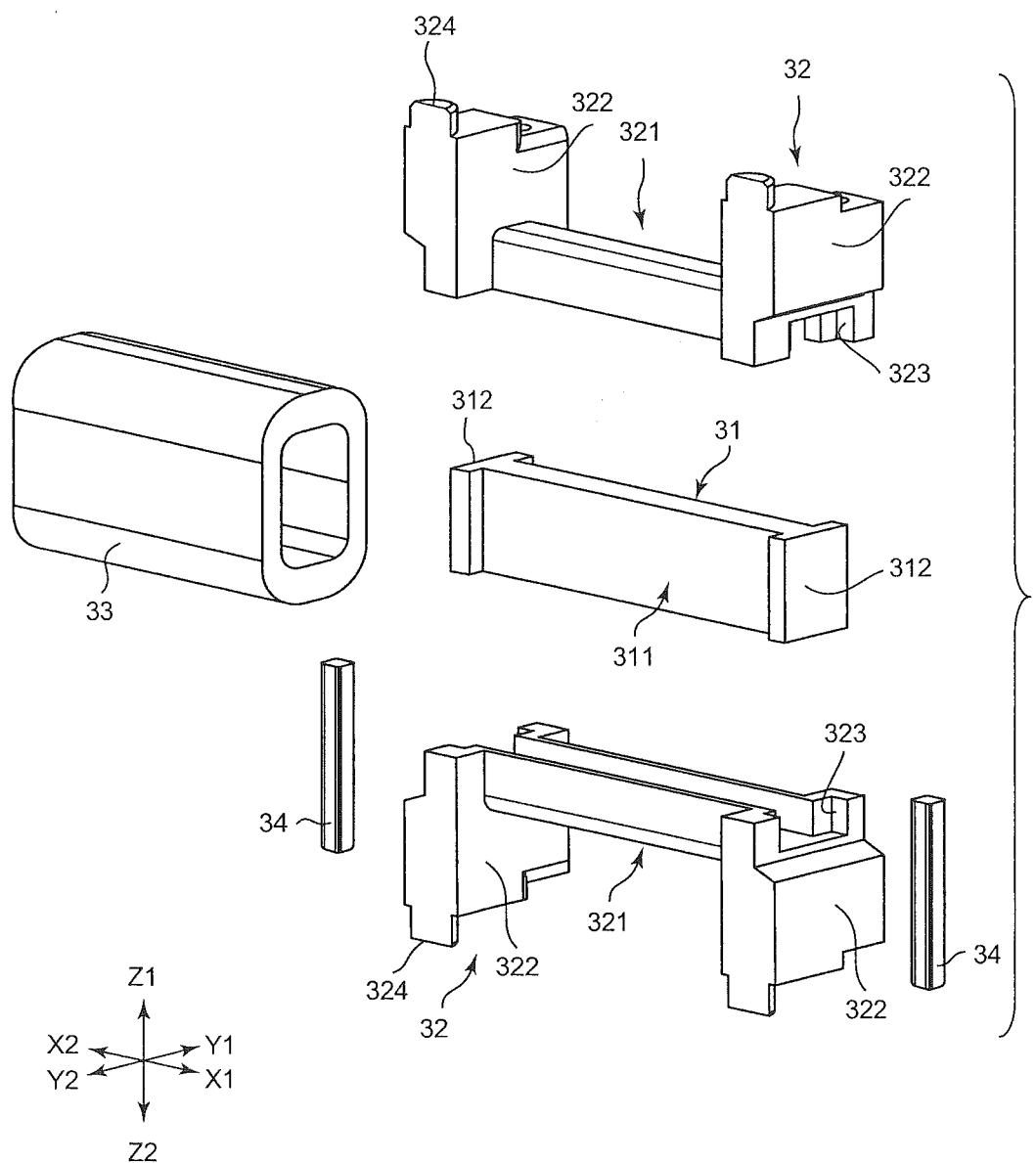
FIG. 5 is an exploded perspective view illustrating the structure of the coil unit in the potential measuring device of FIG. 1.

As illustrated in FIG. 1 to FIG. 4, the potential measuring device 10A has a pair of coil units 30. As illustrated in FIG. 4 and FIG. 5, each coil unit 30 has a yoke 31, a bobbin 32, a coil 33, and a binding pin 34. The yoke 31 allows concentrating a magnetic flux therein and is made of, for example, a soft magnetic material such as iron-based material, soft ferrite, sendust, permalloy, or the like. This yoke 31 is provided with a winding part 311 and yoke flange parts 312. The winding part 311 is a part of the yoke 31 on which the coil 33 is disposed via a winding frame part 321 of the bobbin 32. Further, the yoke flange parts 312 are provided respectively on both end sides of the winding part 311 and are a part larger than the winding part 311 in cross-sectional area allowing the magnetic flux to flow. The yoke flange parts 312 are a part opposing a magnet 80, which will be described later.

Further, the bobbin 32 is formed of, for example, a non-magnetic material such as a resin. In the structure illustrated in FIG. 5, although the bobbin 32 in each coil unit 30 is in a state of being divided in two, the bobbin need not be divided, or a structure in which it is divided into three or more may be employed. Further, in the structure illustrated in FIG. 4, by disposing the bobbins 32 of the pair of coil units 30 adjacently in contact with each other, fixing strength of the pair of coil units 30 is increased.

As illustrated in FIG. 5, the bobbin 32 has a winding frame part 321 and bobbin flange parts 322. The winding frame part 321 is a part covering the winding part 311 of the yoke 31 as described above. Further, a bobbin flange part 322 is a part provided to be larger in cross-sectional area than the winding frame part 321. In this bobbin flange part 322, in a region where a yoke flange part 312 is to be inserted, a cutout 323 is provided by cutting out the bobbin flange part 322 so as to expose the yoke flange part 312 to the outside. Note that the bobbin flange part 322 is provided to be larger in dimension in the Z direction than the yoke flange part 312, but the dimension is of the degree that does not cause the coil 33 to contact with the base part 21 and a printed circuit board 70 when the coil 33 is wound on the winding frame part 321. Further, a positioning part 324 is provided on each of an upper end surface (end surface on a Z1 side) and a lower end surface (end surface on a Z2 side) of the bobbin flange part 322. In the structure illustrated in FIG. 4 and FIG. 5, the positioning parts 324 are a projecting part, and the bobbin 32 is fixed by fitting the positioning parts 324 into positioning recess part (omitted from illustration) of the base part 21 and a positioning recess part (omitted from illustration) of the printed circuit board 70.

Note that as illustrated in FIG. 4, in this embodiment, the pair of bobbins 32 is adjacent and in contact with each other, and the projecting parts of the positioning parts 324 line adjacent to a boundary portion of the contact, thereby forming one large projecting part. Further, the positioning parts 324 may be recess parts, and in this case, positioning projecting parts exist in the base part 21 and the printed circuit board 70, and the bobbin 32 is fixed by fitting of the recess parts and the positioning projecting parts.

Further, as illustrated in FIG. 4, the coil 33 is wound on the winding frame part 321 of the bobbin 32. The coil 33 is structured by winding a winding wire (omitted from illustration) predetermined times on the winding frame part 321, and an end of this winding wire is bound on the binding pin 34 in a state that an insulating coating of a winding wire surface is removed. Further, the binding pin 34 is a pin-shaped member positioned in a cutout 23 of the above-described frame member 20, and is formed of, for example, a material having conductivity such as metal. The end of the winding wire is wound predetermined times on this binding pin 34, and thereafter the end and the binding pin 34 are joined in an electrically conductive state by a method such as soldering.

Note that in the following description, the coil 33 operating on a first shutter system 400A (which will be described later) will be referred to as a coil 331, and the coil 33 operating on a second shutter system 500A (which will be described later) will be referred to as a coil 332, as necessary.

As illustrated in FIG. 1 and FIG. 2, the first shutter 40A and the second shutter 50A are attached to the frame member 20 to line along the forward and backward direction (Y direction). Note that in the structure illustrated in FIG. 1, the first shutter 40A is located on a Y2 side, and the second shutter 50A is located on a Y1 side. The first shutter 40A and the second shutter 50A are formed of a material which excels in spring property and has conductivity. Examples of such materials include phosphor bronze, beryllium steel, SUS304, and the like, but any other metal may be used as the material.

The first shutter 40A and the second shutter 50A each have a pair of leaf spring parts 41, 51, flange parts 42, 52, an extending part 43, 53, and a shutter part 44, 54. The leaf spring parts 41, 51 are leg-like parts extending along the Z direction in FIG. 1 and FIG. 2, and on its lower end side (end portion side on the Z2 side) the flange parts 42, 52 are provided. Note that as illustrated in FIG. 2, in this embodiment, the leaf spring parts 41 of the first shutter 40A are provided to be larger in dimension along the Z direction than the leaf spring parts 51 of the second shutter 50A, and the extending part 43 and the shutter part 44 of the first shutter 40A and the extending part 53 and the shutter part 54 of the second shutter 50A are provided to oppose each other without colliding against each other with a predetermined gap intervening therebetween. Further, in a direction along the X direction, regions opposing the yoke flange parts 312 located on the Y2 side exist on the leaf spring parts 41 of the first shutter 40A, and regions opposing the yoke flange parts 312 located on the Y1 side exist on the leaf spring parts 51 of the second shutter 50A.

The flange parts 42, 52 are parts bent from lower ends (end portions on the Z2 side) of the leaf spring parts 41, 51 so as to extend along the X direction, and the flange parts 42, 52 are attached to the frame member 20, thereby fixing the entire first shutter 40A and second shutter 50A on the frame member 20. Further, the extending part 43 is a part existing between the leaf spring parts 41 and the shutter part 44 to extend along the X direction on upper end sides (end portions on the Z1 side) of the leaf spring parts 41, and similarly the extending part 53 is a part existing between the leaf spring parts 51 and the shutter part 54 to extend along the X direction on upper end sides (end portions on the Z1 side) of the leaf spring parts 51.

As illustrated in FIG. 1, the shutter part 44, 54 is coupled to the extending part 43, 53. A portion projecting toward the Y1 side from the extending part 43 exists on the shutter part 44 of the first shutter 40A, and a portion projecting toward the Y2 side from the extending part 53 exists on the shutter part 54 of the second shutter 50A. Thus, in the structure illustrated in FIG. 1, each shutter part 44, 54 is provided to be wider than the other portion of the extending part 43, 53, and an opening 45, 55, which will be described later, can be positioned at an identical position on an XY plane. Note that the shutter part 44, 54 may be provided to have about the same width as the other portion of the extending part 43, 53. In this case, the extending part 43, 53 including the shutter part 44, 54 is provided in a crank shape projecting toward the Y1 side, and the extending part 43, 53 including the shutter part 44, 54 is provided in a crank shape projecting toward the Y2 side.

This shutter part 44, 54 is provided with the opening 45, 55. The opening 45, 55 is a hole portion punched through the shutter part 44, 54. Note that in this embodiment, the size and shape of the opening 45, 55 are set identical between the first shutter 40A and the second shutter 50A, and it is possible to realize an open state in which many electric flux lines heading from a detection target object toward the sensor electrode 60 pass through, and a closed state in which the electric flux lines are mostly blocked. However, when good open and closed states can be realized, the opening 45 of the first shutter 40A and the opening 55 of the second shutter 50A need not be of the identical size and shape.

Further, on an upper side (Z1 side) of the coil unit 30, that is, on a lower side (Z2 side) of the first shutter 40A and the second shutter 50A, the sensor electrode 60 (corresponding to a sensor) is disposed. The sensor electrode 60 has leg parts 61 and flange parts 62, and has a detecting part 63. The leg parts 61 and the flange parts 62 in the sensor electrode 60 are similar to the leaf spring parts 41, 51 and the flange parts 42, 52 of the above-described first shutter 40A and second shutter 50A, and thus their descriptions are omitted. Among them, the leg parts 61 separate the detecting part 63 from the printed circuit board 70 to make the detecting part 63 close to the side of the shutter parts 44, 54 in order to increase the detection sensitivity of the detecting part 63. This detecting part 63 is provided to be in parallel to the shutter parts 44, 54.

The area of an upper surface side of the detecting part 63 corresponds to the opening area of the opening 45, 55. To obtain good detection sensitivity in the detecting part 63, it is preferred that the area of the upper surface side of the detecting part 63 be equal to or slightly larger than the area of the opening 45, 55, but the area of the upper surface side of the detecting part 63 may be smaller than the area of the opening 45, 55.

Such a sensor electrode 60 forms electric flux lines between itself and the detection target object existing on the upper side (Z1 side). Then, the shutter parts 44, 54 are located between the detection target object and the sensor electrode 60, and when the shutter parts 44, 54 move along the X direction, the ratio of blocking the electric flux lines in the Z direction by the shutter parts 44, 54 which are metal changes, and thereby an alternating current is obtained in the sensor electrode 60. In a detection circuit (existing in the printed circuit board 70) in which the alternating current flows, a voltage (amplitude) corresponding to the charge of the detection target object is obtained. Then, the charge in the detection target object can be measured from such a voltage.

Further, the printed circuit board 70 to which the sensor electrode 60 is attached has holes 71 through which the leaf spring parts 41, 51 of the first shutter 40A and the second shutter 50A can be inserted. The holes 71 are provided to have dimensions of a degree that, when an electric current is conducted through the coil 33 and the leaf spring parts 41, 51 vibrate in the X direction, they do not interfere with this vibration of the leaf spring parts 41, 51. Note that the printed circuit board 70 may be included in the concept of the potential measuring device 10A, but the printed circuit board 70 need not be included in the concept of the potential measuring device 10A.

Further, among the respective leaf spring parts 41 of the first shutter 40A and the respective leaf spring parts 51 of the second shutter 50A, the magnets 80 are attached to the regions opposing the yoke flange parts 312. In this embodiment, as illustrated in FIG. 1 and FIG. 2, the magnets 80 are provided so as to oppose the regions of the bobbin flange parts 322 where the cutouts 323 exist. In the structure illustrated in FIG. 1 and FIG. 2, the magnets 80 are attached to surfaces of the leaf spring parts 41, 51, the surfaces opposing the yoke flange parts 312. Then, the magnets 80 attached respectively to the pair of leaf spring parts 41, 41 of the first shutter 40A are magnetized so that the same magnetic poles oppose each other, and similarly, the magnets 80 attached respectively to the pair of leaf spring parts 51, 51 of the second shutter 50A are magnetized so that the same magnetic poles oppose each other. Further, the respective magnets 80 are magnetized so that when the shutter part 44 of the first shutter 40A moves toward one side in the X direction, the shutter part 54 of the second shutter 50A moves toward the other side in the X direction.

Note that a system to which the magnets 80 are attached to the first shutter 40A (hereinafter referred to as a first shutter system 400A) and a system to which the magnets 80 are attached to the second shutter 50A (hereinafter referred to as a second shutter system 500A) are designed so that their natural frequencies become equal. Thus, the systems are each set to produce resonance at frequencies (predetermined frequencies) matching each other when the potential measuring device 10A operates. However, due to manufacturing errors or the like of the first shutter 40A, the second shutter 50A, and so on, a deviation may occur between the natural frequencies of the first shutter system 400A and the second shutter system 500A. To calibrate to such a deviation of natural frequencies, a balance adjusting mechanism 100 as follows is provided.

<Regarding Balance Adjusting Mechanism 100>

As illustrated in FIG. 1 to FIG. 3 and the like, the potential measuring device 10A is provided with a balance adjusting mechanism 100. The balance adjusting mechanism 100 has adjusting back yokes 110 formed of the same soft magnetic material as that of the above-described yokes 31, but the adjusting back yokes 110 may be formed of a different soft magnetic material from that of the yokes 31. Further, in this embodiment, each adjusting back yoke 110 has an appearance in a substantially columnar shape. An end surface (opposing end surface 111) on the side of such an adjusting back yoke 110 that opposes a magnet 80 is flat. Further, in this embodiment, a slit 113 for allowing fitting of the tip of a screw driver is provided in an end surface (external end surface 112) on a side of the adjusting back yoke 110, the side being far from the magnet 80.

Further, a thread part 114 in which a screw thread is formed is provided in an outer peripheral portion of the adjusting back yoke 110. Here, in the rising parts 22 of the frame member 20, a screw hole 22a is formed in each region opposing a magnet 80 in the X direction. It is possible to screw the thread part 114 into the screw hole 22a. Specifically, by fitting the tip of a screwdriver in the slit 113 and rotating the adjusting back yoke 110, the adjusting back yoke 110 moves along the X direction, and thereby the adjusting back yoke 110 is moved toward or away from the magnet 80. Accordingly, the gap between the magnet 80 and the adjusting back yoke 110 varies, and a magnetic force therebetween changes. Then, the change of the magnetic force by this adjustment of gap causes a change of the natural frequency in the first shutter system 400A or the second shutter system 500A.

Further, in a state that the adjusting back yoke 110 is screwed into the screw hole 22a, the opposing end surface 111 is in parallel to the opposing surface of the leaf spring part 41, 51. Thus, it is possible to widen an adjusting width of the gap. However, in the case where the gap between the adjusting back yoke 110 and the magnet 80 and the gap between the magnet 80 and the yoke 31 are the same, and the magnetic coupling force of the former is larger (stronger) than the magnetic coupling force of the latter, or in similar cases, the opposing end surface 111 need not be in parallel to the opposing surface of the leaf spring part 41, 51. Further, although it is preferred that the opposing end surface 111 be flat, in the case where it is stronger than the magnetic coupling force between the magnet 80 and the yoke 31, or in similar cases, the opposing end surface 111 may be in a state that irregularities exist thereon.

Note that the balance adjusting mechanism 100 corresponds to a natural frequency adjusting means. The concept of this balance adjusting mechanism 100 may include the rising parts 22 beside the adjusting back yoke 110, but the rising parts 22 may be excluded.

<Regarding Operations>

Operations of the potential measuring device 10A having the above-described structure will be described below.

In order for the potential measuring device 10A to operate, an alternating current is conducted through the pair of coils 33 by a driving circuit which is not illustrated. In this case, the alternating current is applied to the coil 331 giving a magnetic force to the first shutter 40A and the coil 332 giving a magnetic force to the second shutter 50A so that the phases of vibrations of the shutter part 44 of the first shutter 40A and the shutter part 54 of the second shutter 50A are reversed. Making the vibrations of the two shutter parts 40A, 50A of reverse phases can be realized by either of a configuration such that the current directions of the two coils 33 are of the same phase and the magnets 80 be in opposite directions, or a configuration such that the current directions of the two coils 33 are of reverse phases and the magnets 80 be in the same direction, as will be described later. In this case, in the first shutter 40A and the second shutter 50A, by the magnetic forces between the magnets 80 and the coil 33 and between the magnets 80 and the yoke 31, the leaf spring parts 41, 51 deform to bend with portions on the sides of the flange parts 42, 52 being the fulcrum, and the shutter parts 44, 54 are made to move according to the amount of bending of the bending deformation.

Here, in each of the first shutter system 400A and the second shutter system 500A, a resonance occurs when frequencies of alternating currents to be conducted through the coils 33 are equal to the respective natural frequencies of the first shutter system 400A and the second shutter system 500A (when they are resonance frequencies). In this case, as compared to the case where the frequencies of the alternating currents are not the resonance frequencies, the amplitudes of the respective shutter parts 44, 54 become large.

On the other hand, no resonance occurs when the frequencies of the alternating currents are not equal to the respective natural frequencies of the first shutter system 400A and the second shutter system 500A, and the natural frequencies are deviated from the frequencies of the respective alternating currents. In this case, the amplitudes of the shutter parts 44, 54 become smaller than in the case of vibrating at the natural frequencies.

Figure 6A:
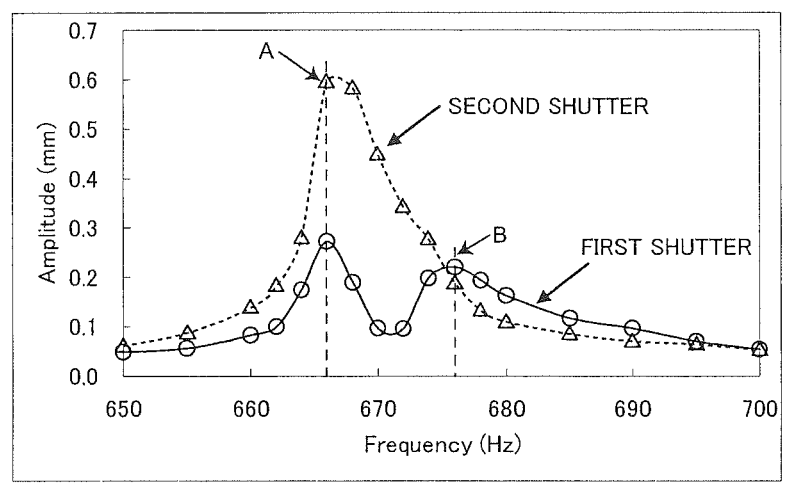
FIG. 6a is a diagram illustrating the relation between a frequency of an alternating current and an amplitude of a shutter when an amplitude of a second shutter is larger than an amplitude of a first shutter in the potential measuring device of FIG. 1.
Figure 6B:
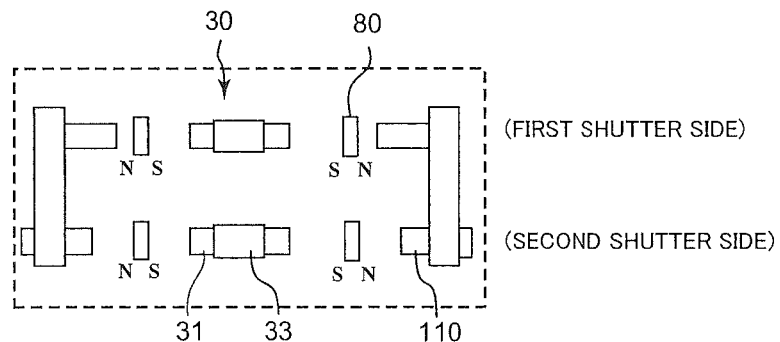

This point will be described in detail based on FIG. 6 to FIG. 9. FIG. 6a illustrates the case where the positional relation between the adjusting back yokes 110, the magnets 80, and the yokes 31 are as in a state illustrated in FIG. 6b, in which the vertical axis represents amplitudes of the shutter parts 44, 54, and the horizontal axis represents frequencies of the alternating currents applied to the coils 33.

In above-described FIG. 6a, in the second shutter system 500A, a large amplitude is obtained at its natural frequency. At this time, in the second shutter system 500A, the natural frequency is at or in the vicinity of the point A in FIG. 6a. On the other hand, in the first shutter system 400A, the natural frequency does not match that of the second shutter system 500A. Specifically, the maximum amplitude of the first shutter system 400A is at or in the vicinity of the point A where the frequency of the alternating current is equal to the natural frequency of the second shutter system 500A. However, in the first shutter system 400A, it is conceivable that it is affected by the vibrations of the second shutter system 500A at or in the vicinity of the point A, and the amplitude is increased. Specifically, in this embodiment, the first shutter 40A and the second shutter 50A are attached to the frame member 20 made of metal without intervention of a damper. Accordingly, the first shutter 40A and the second shutter 50A are structured to exert influence of vibrations on each other, and consequently, in the first shutter system 400A, the maximum amplitude is obtained in a portion other than the natural frequency.

However, in FIG. 6a, the actual natural frequency of the first shutter system 400A is at or in the vicinity of the point B, which is the peak of a second peak in FIG. 6a. Here, in FIG. 6a, judgment of the point B or its vicinity as the natural frequency is based also on the following point. Specifically, as in the case where the coil 33 is used, when an input (=external force) is regular like a sine wave, the resonance curve and the phase curve of vibrations thereof become ones illustrated in FIGS. 7a, 7b.

Figure 7A:
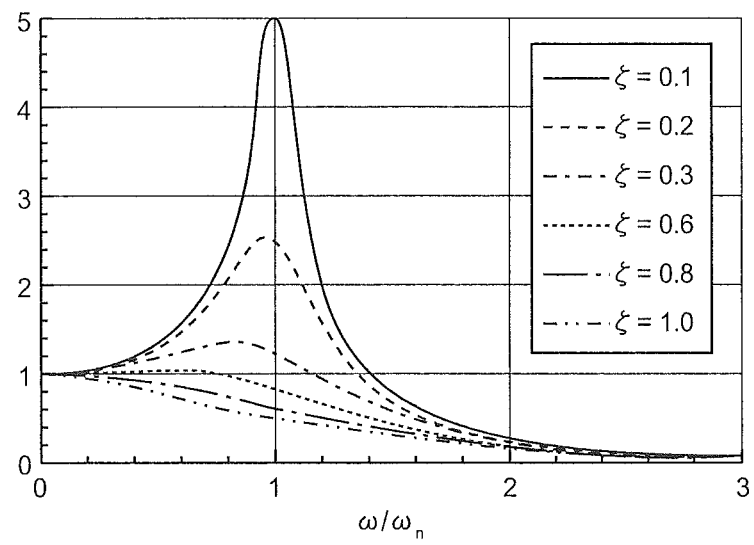
FIG. 7a illustrates resonance curves in the case of forced vibration of a single degree of freedom system.
Figure 7B:
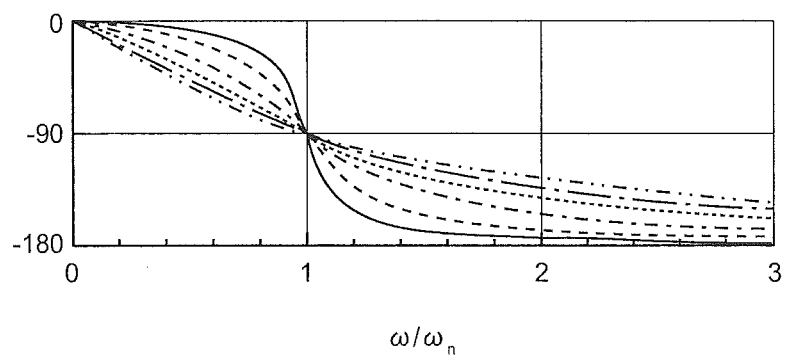
FIG. 7b illustrates phase curves in the case of forced vibration of the single degree of freedom system.

Note that FIG. 7a illustrates resonance curves in the case of forced vibration of a single degree of freedom system, and FIG. 7b illustrates phase curves in the case of forced vibration of the single degree of freedom system. In FIG. 7a, Xst is a change when a static load is applied on an elastic body, X denotes an amplitude, X/Xst on the vertical axis denotes an amplitude magnification, ω is a frequency of external force to be given, ωn denotes a fundamental circular frequency (natural angular frequency), and ω/ωn on the horizontal axis denotes a frequency ratio. Further, ζ denotes an attenuation factor, and FIG. 7a illustrates a state that as the attenuation factor ζ becomes larger, the amplitude at a time of ω/ωn=1 (that is, the external force matches the natural frequency) becomes smaller. Further, in FIG. 7b, φ on the vertical axis denotes a phase, and ω/ωn on the horizontal axis is the same as that of FIG. 7a. Further, FIG. 7b illustrates a state that as the attenuation factor ζ becomes larger, a deviation of a phase at a time of deviating from ω/ωn=1 becomes smaller.

As illustrated in FIG. 7b, when the cycle ω of the external force matches the fundamental circular frequency (natural angular frequency) con, with respect to an input (=external force), the phase of obtained vibrations (=output; deviation of the shutter parts 44, 54 in this embodiment) becomes φ=0, and the phases of the input (=external force) and the output (=amplitude) are deviated by 90 degrees. However, when the cycle ω of the external force deviates from the fundamental circular frequency (natural angular frequency) con, the deviations of phases between the input and the output increases further from the 90 degrees as indicated on the phase curves illustrated in FIG. 7b. Accordingly, by measuring whether or not the phases between input and output are deviated by 90 degrees, it is possible to determine what region the natural frequency is at in FIG. 6a. Here, in the first shutter system 400A, the phases between input and output are measured to be matching at or in the vicinity of the point B, and thus the point B or its vicinity is determined to be the natural frequency in the first shutter system 400A.

Figure 9A:
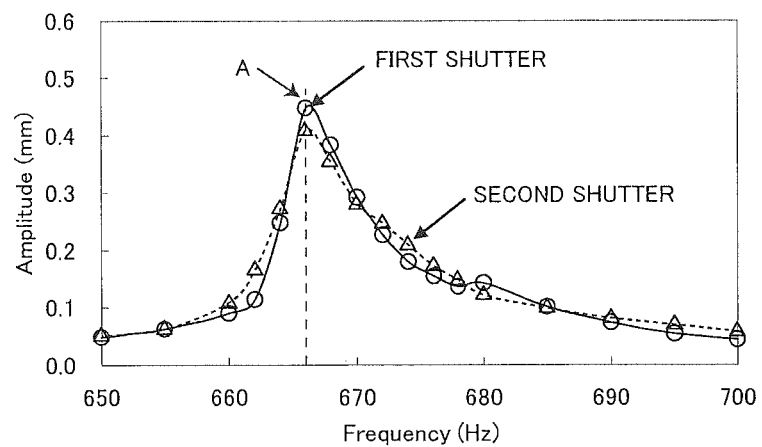
FIG. 9a is a diagram illustrating the relation between a frequency of an alternating current and an amplitude of a shutter when natural frequencies of the first shutter and the second shutter match in the potential measuring device of FIG. 1.
Figure 9B:
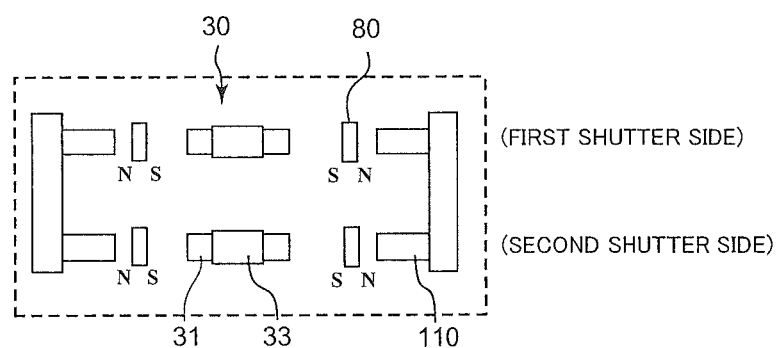

Incidentally, a portion where two of the opening 45 of the first shutter 40A and the opening 55 of the second shutter 50A overlap with each other lets electric flux lines from the charged object as the measurement target pass through to the sensor electrode 60. The area of the portion of overlap is defined as an opening area S. The opening area S changes by anti-phase vibrations of the first shutter system 400A and the second shutter system 500A, and this change causes a change of the electric flux lines from the charged object as the measurement target to the sensor electrode 60. Note that the aforementioned change of the electric flux lines corresponds to a change of output of the sensor electrode 60, and this change of output corresponds to an alternating current signal. Therefore, the magnitude of the change of the opening area S is the magnitude of the output, that is, sensitivity of the sensor electrode 60. However, when the natural frequencies are different between the first shutter system 400A and the second shutter system 500A as illustrated in FIG. 6a, a fluctuation amplitude of the opening area S, the fluctuation amplitude being generated by overlapping of the amplitude of the first shutter system 400A and the amplitude of the second shutter system 500A with each other, becomes smaller than the case where the natural frequencies match as illustrated in FIG. 9, which will be described later. This is caused by that in the region of the natural frequency of either one of the first shutter system 400A and the second shutter system 500A, the amplitude of the other is small, and is also caused by that the phases of the both vibrations (=outputs) are different between the first shutter system 400A and the second shutter system 500A.

Specifically, for example, in the case where the phases of the both amplitudes (=outputs) are different, when one of the shutter parts 44, 54 is located on an end portion on the X1 side, the other of the shutter parts 44, 54 is not located on the X2 side but is located in a region deviated by a predetermined phase therefrom. From this point, an actual change ΔS of the opening area S is smaller than a change ΔS of the opening area S corresponding to the sum of the amplitude at a time the second shutter system 500A illustrated in the graph of FIG. 6a has a frequency matching the natural frequency (resonance frequency; point A or its vicinity) and the amplitude of the first shutter system 400A at this resonance frequency.

From the above points, when the phases of the both vibrations (=outputs) of the first shutter system 400A and the second shutter system 500A are different (that is, when the natural frequencies of the both do not match), the change ΔS of the opening area S of the opening 45, 55 is small as compared to the case where the natural frequencies thereof match, and the sensitivity thereof decreases as a result.

Figure 8A:
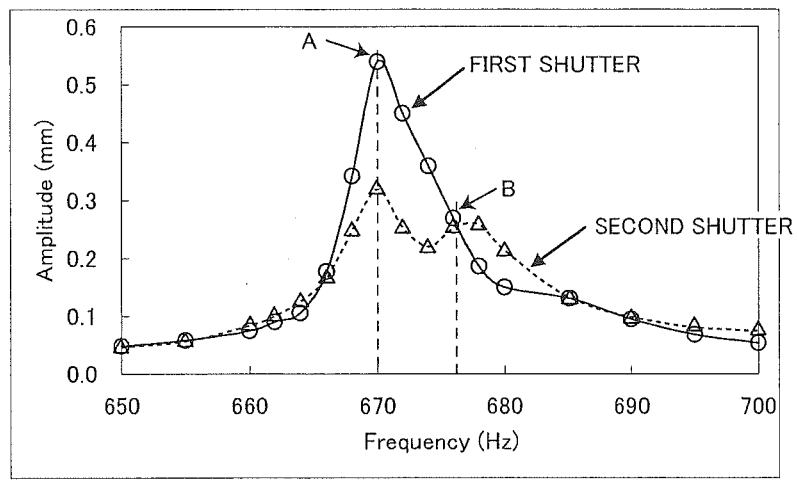
FIG. 8a is a diagram illustrating the relation between a frequency of an alternating current and an amplitude of a shutter when the amplitude of the first shutter is larger than the amplitude of the second shutter in the potential measuring device of FIG. 1.
Figure 8B:
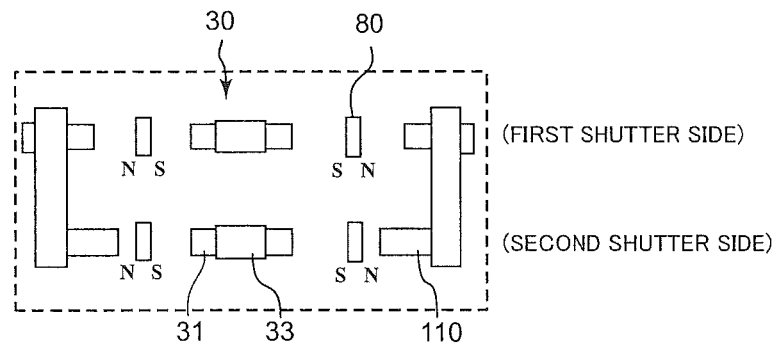

The above points apply also to FIGS. 8a, 8b. Specifically, one in which the first shutter system 400A and the second shutter system 500A are reversed in FIG. 6a corresponds to FIG. 8a. Accordingly, a detailed description of this is omitted in FIGS. 8a, 8b.

As described above, FIG. 6 is an example in which the frequency of the alternating current of the coil 33 when the second shutter system 500A has the maximum amplitude substantially matches the natural frequency of the second shutter system 500A, and the frequency of the alternating current at that time (that is, the frequency of the alternating current of the coil 33 when the second shutter system 500A has the maximum amplitude) does not match the natural frequency of the first shutter system 400A. On the other hand, FIG. 8 is an example in which the frequency of the alternating current of the coil 33 when the first shutter system 400A has the maximum amplitude substantially matches the natural frequency of the first shutter system 400A, and the frequency of the alternating current at that time (that is, the frequency of the alternating current of the coil 33 when the first shutter system 400A has the maximum amplitude) does not match the natural frequency of the second shutter system 500A. With respect to FIG. 6 and FIG. 8 as described above, when the balance adjusting mechanism 100 in this embodiment is used, it is possible to make the natural frequencies match as illustrated in FIG. 9a from a state that the natural frequencies do not match (deviate). Specifically, when an adjusting back yoke 110 is screwed in, the gap between the magnet 80 and the adjusting back yoke 110 varies, and the magnetic force therebetween changes. Further, the gap from the yoke 31 to the adjusting back yoke 110 also varies. Accordingly, the natural frequency of the shutter system in which the adjusting back yoke 110 that is screwed in is located (at least one of the first shutter system 400A and the second shutter system 500A) varies, and thereby the natural frequency of the first shutter system 400A and the natural frequency of the second shutter system 500A can be matched.

<Regarding Effects>

In the potential measuring device 10A structured as above, in this embodiment, the balance adjusting mechanism 100 is provided. Then, in this balance adjusting mechanism 100, the natural frequency of at least one of the first shutter system 400A and the second shutter system 500A is adjustable. Thus, the natural frequency of the first shutter system 400A and the natural frequency of the second shutter system 500A can be matched. Thus, the change ΔS of the opening area S can be made larger than in the case where the natural frequencies do not match, and measurement sensitivity of the potential measuring device 10A can be improved.

Specifically, in the potential measuring device 10A in this embodiment, the adjusting back yokes 110 are provided in the balance adjusting mechanism 100, and the magnetic forces between this adjusting back yokes 110 and the magnets 80 can be adjusted. Thus, the natural frequency of the first shutter system 400A and the natural frequency of the second shutter system 500A can be matched, and the measurement sensitivity of the potential measuring device 10A can be improved.

Further, in this embodiment, the balance adjusting mechanism 100 for adjusting the natural frequencies has the adjusting back yokes 110 opposing the yokes 31 with the magnets 80 intervening therebetween, and further has the rising parts 22 supporting the adjusting back yokes 110. By employing such a structure, the magnetic balance among the yokes 31, the magnets 80, and the adjusting back yokes 110 can be changed easily by moving the adjusting back yokes 110 toward or away from the magnets 80. Thus, the natural frequency of at least one of the first shutter system 400A and the second shutter system 500A can be adjusted easily, and thereby the measurement sensitivity of the potential measuring device 10A can be improved.

Moreover, in this embodiment, the thread part 114 is provided in the outer peripheral portion of each adjusting back yoke 110, and the screw hole 22a is formed in the rising part 22. Thus, by screwing the thread part 114 of the adjusting back yoke 110 into the screw hole 22a, and adjusting the degree of screwing thereof, the magnetic force between the magnet 80 and the adjusting back yoke 110 can be adjusted. Then, by such adjustment, the natural frequency of at least one of the first shutter system 400A and the second shutter system 500A can be adjusted, and the measurement sensitivity of the potential measuring device 10A can be improved.

Further, in this embodiment, the first shutter 40A and the second shutter 50A are disposed to oppose each other in the Z direction. When such a structure is employed, it is possible to dispose the openings 45, 55 to oppose each other in a state that the respective opening areas are increased, and by such an increase in areas of the openings 45, 55, good sensitivity of the potential measuring device 10A can be obtained.

Other Embodiments

Next, other embodiments of the present invention will be described. Note that in the other embodiments, same components as those in the potential measuring device 10A of the above-described first embodiment are given the same reference numerals for description.

<Another Potential Measuring Device—Part 1>

Figure 10:
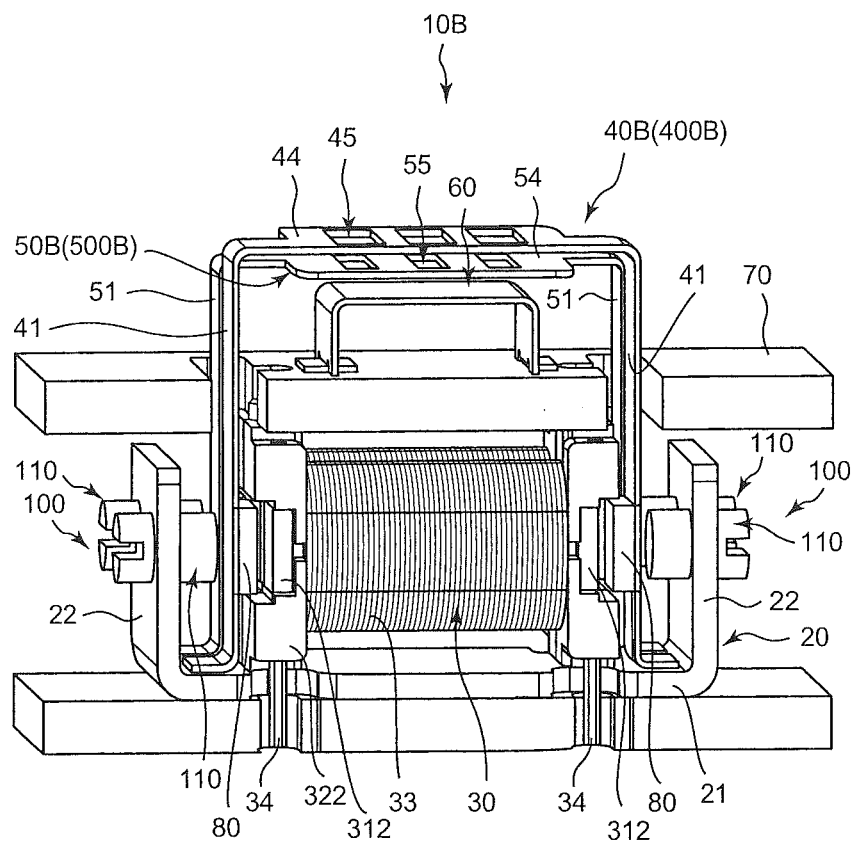
FIG. 10 is a perspective view illustrating a potential measuring device according to a modification example of the present invention which has shutter parts in which three openings are provided in each shutter part.

FIG. 10 is a perspective view illustrating a potential measuring device 10B according to another embodiment. In this potential measuring device 10B, openings 45, 55 of respective shutter parts 44, 54 of a first shutter 40B and a second shutter 50B are different from those of the potential measuring device 10A. Specifically, in the potential measuring device 10B illustrated in FIG. 10, pluralities of openings 45, 55 are provided to line in the X direction in the shutter parts 44, 54 (three each in the respective shutter parts 44, 54 in FIG. 10). Note that the openings 45, 55 are not limited to the structure in which three each of them are provided in the respective shutter parts 44, 54 as illustrated in FIG. 10, and any number of them may be provided as long as it is two or more. Further, in the structure illustrated in FIG. 10, the openings 45 in the first shutter 40B are provided to be larger in opening area than the openings 55 in the second shutter 50B, but it is not necessary to employ such a structure.

<Another Potential Measuring Device—Part 2>

Figure 11:
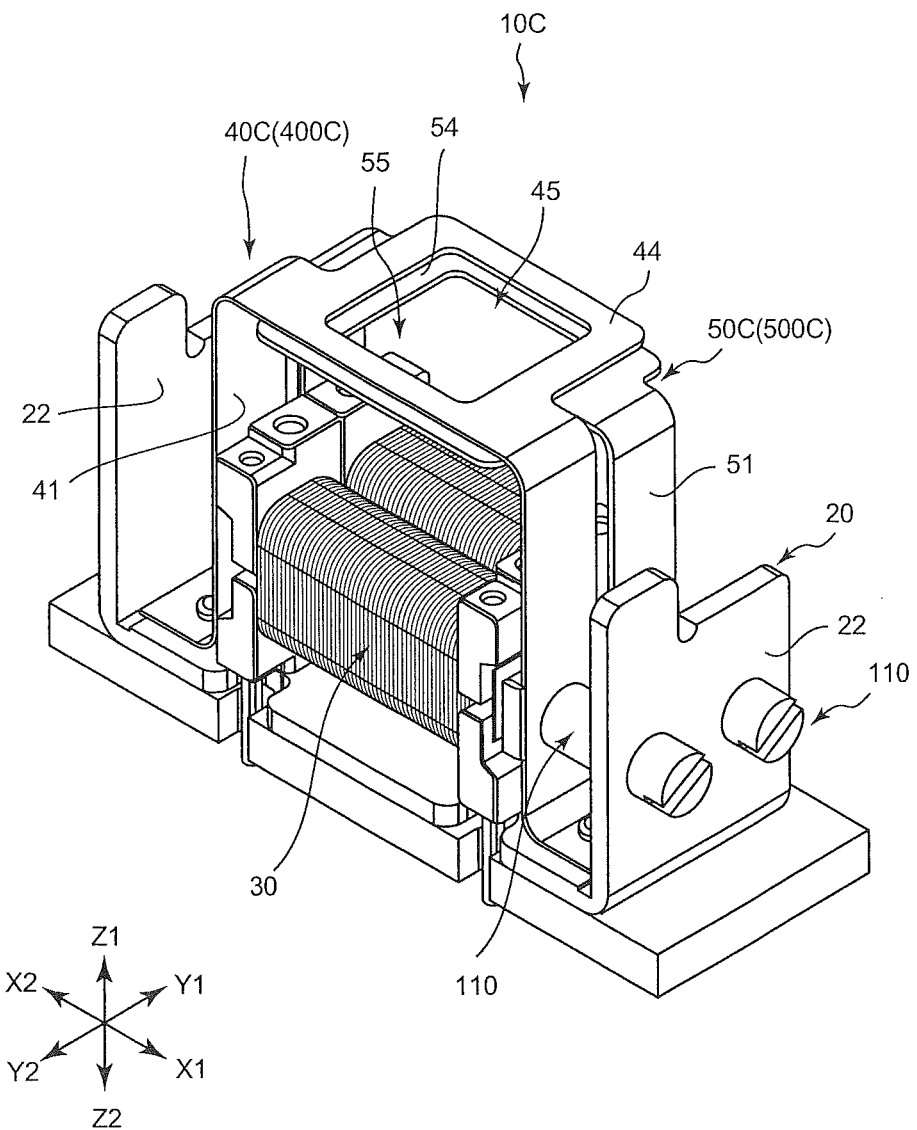
FIG. 11 is a perspective view illustrating a structure according to a modification example of the present invention in which adjusting back yokes and magnets are provided on one side in a longitudinal direction, and they are not provided on the other side in the longitudinal direction.

Further, a potential measuring device 10C as illustrated in FIG. 11 may be employed. The potential measuring device 10C illustrated in FIG. 11 is obtained by changing the structure of the balance adjusting mechanism 100 in the potential measuring device 10A illustrated in FIG. 1. As illustrated in FIG. 11, in the potential measuring device 10C, adjusting back yokes 110 and magnets 80 are provided on one side in a longitudinal direction (X1 side), but the adjusting back yokes 110 and the magnets 80 are not provided on the other side in the longitudinal direction (X2 side).

Also in such a potential measuring device 10C having a structure as illustrated in FIG. 11, on one side in the longitudinal direction (X1 side), adjustment of natural frequency is possible in at least one of a first shutter system 400C and a second shutter system 500C. Note that although the magnets 80 are not provided on the other side in the longitudinal direction (X2 side) in the potential measuring device 10C illustrated in FIG. 11, the magnets 80 may be provided therein.

<Another Potential Measuring Device—Part 3>

Figure 12:
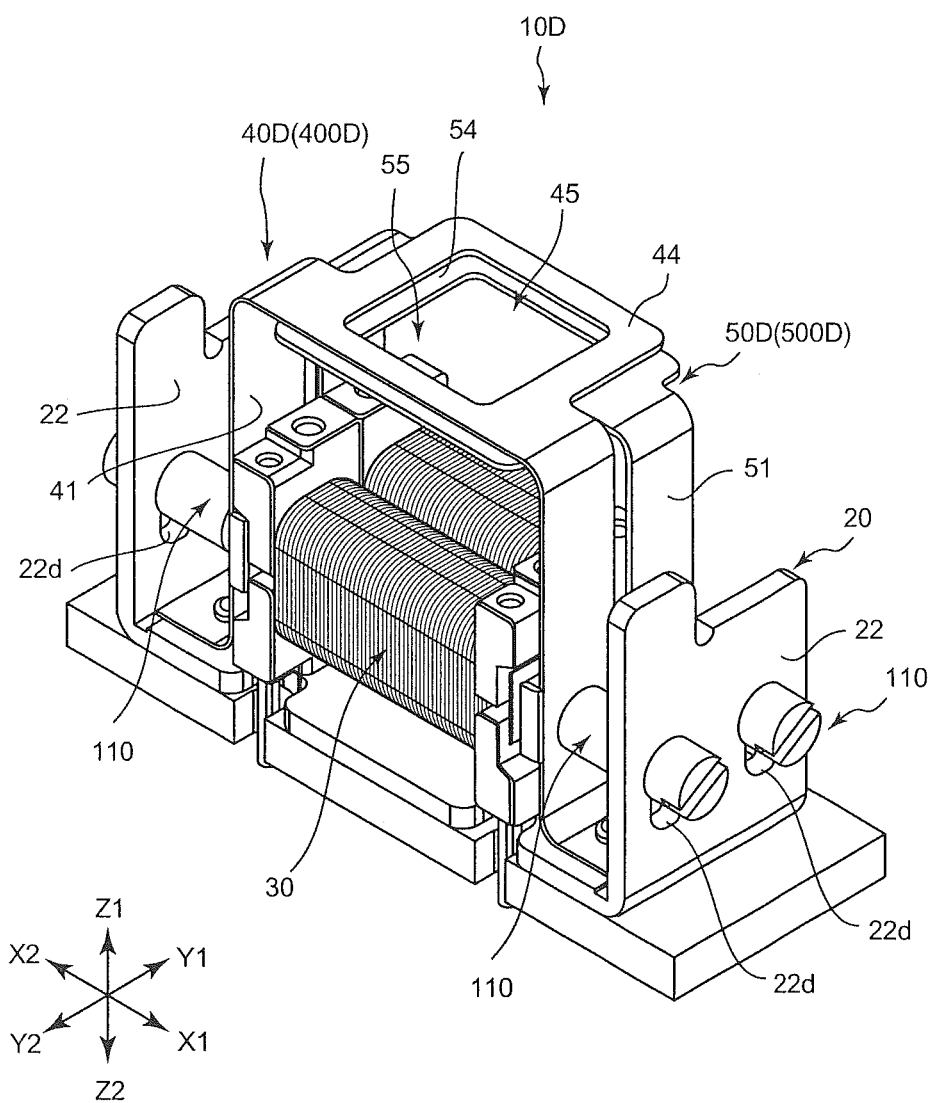
FIG. 12 is a perspective view illustrating a structure of a potential measuring device according to a modification example of the present invention in which screw holes into which adjusting back yokes are screwed are provided to have a long hole shape which is long in an upward and downward direction.

Further, a potential measuring device 10D as illustrated in FIG. 12 may be employed. In the potential measuring device 10D illustrated in FIG. 12, part of the balance adjusting mechanism 100 is different from the potential measuring device 10A illustrated in FIG. 1. Specifically, in the potential measuring device 10D illustrated in FIG. 12, screw holes 22d provided in a rising part 22 of each frame member 20 are provided to have a long hole shape instead of circular holes like the screw holes 22a of the potential measuring device 10A illustrated in FIG. 1. A screw hole 22d has a semicircular portion in both upper and lower ends, and a portion connecting these upper and lower semicircular portions has a certain width. Owing to such a shape, adjusting back yokes 110 can be moved along the upward and downward direction (Z direction) in the screw holes 22d.

In the potential measuring device 10D having such a structure illustrated in FIG. 12, besides adjustment of screwing amounts of the adjusting back yokes 110 into the screw holes 22d, positions in the upward and downward direction (Z direction) of the adjusting back yokes 110 are also adjustable. With such adjusting back yokes 110, adjustment of natural frequency is possible not only by adjustment of screwing amounts of the adjusting back yokes 110, but also by adjustment of positions of the adjusting back yokes 110 in the Z direction.

<Another Potential Measuring Device—Part 4>

Figure 13:
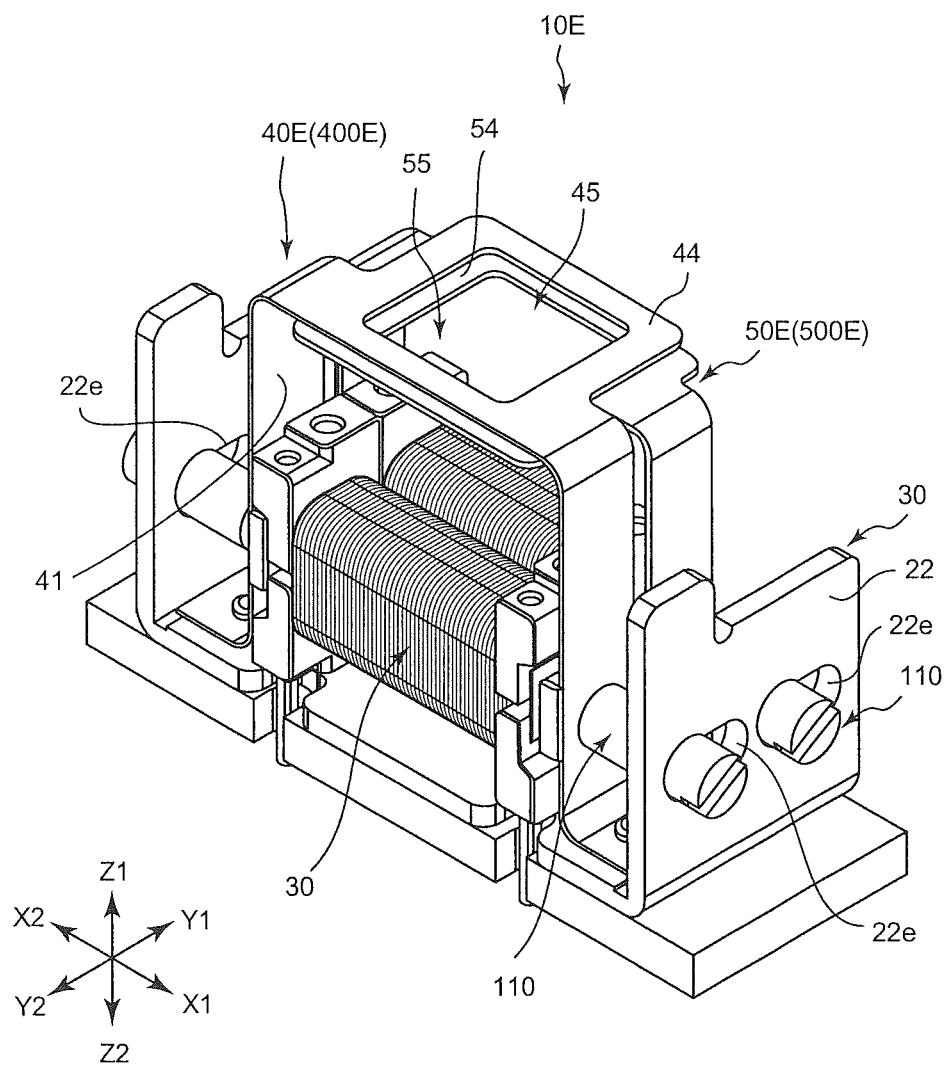
FIG. 13 is a perspective view illustrating a structure of a potential measuring device according to a modification example of the present invention in which screw holes into which adjusting back yokes are screwed are provided to have a long hole shape which is long in a forward and backward direction.

Further, a potential measuring device 10E as illustrated in FIG. 13 may be employed. In the potential measuring device 10E illustrated in FIG. 13, although it is similar to the potential measuring device 10D illustrated in FIG. 12, directions of screw holes 22e having a long hole shape are different from those of the screw holes 22d similarly having a long hole shape. Specifically, in the potential measuring device 10E illustrated in FIG. 13, the screw holes 22e have a semicircular portion in both ends in the forward and backward direction (Y direction), and a portion connecting these forward and backward semicircular portions has a certain width. Owing to such a shape, adjusting back yokes 110 can be moved along the forward and backward direction (Y direction) in the screw holes 22e.

In the potential measuring device 10E having such a structure illustrated in FIG. 13, besides adjustment of screwing amounts of the adjusting back yokes 110 into the screw holes 22e, positions in the forward and backward direction (Y direction) of the adjusting back yokes 110 are also adjustable. With such adjusting back yokes 110, adjustment of natural frequency is possible not only by adjustment of screwing amounts of the adjusting back yokes 110, but also by adjustment of positions of the adjusting back yokes 110 in the Y direction.

<Other Potential Measuring Devices—Part 5>

Further, in the above-described potential measuring devices 10A, 10B, 10D, 10E, a structure as illustrated in FIG. 14 to FIG. 17 may be employed as the coil unit 30 and/or the balance adjusting mechanism 100.

Figure 14:
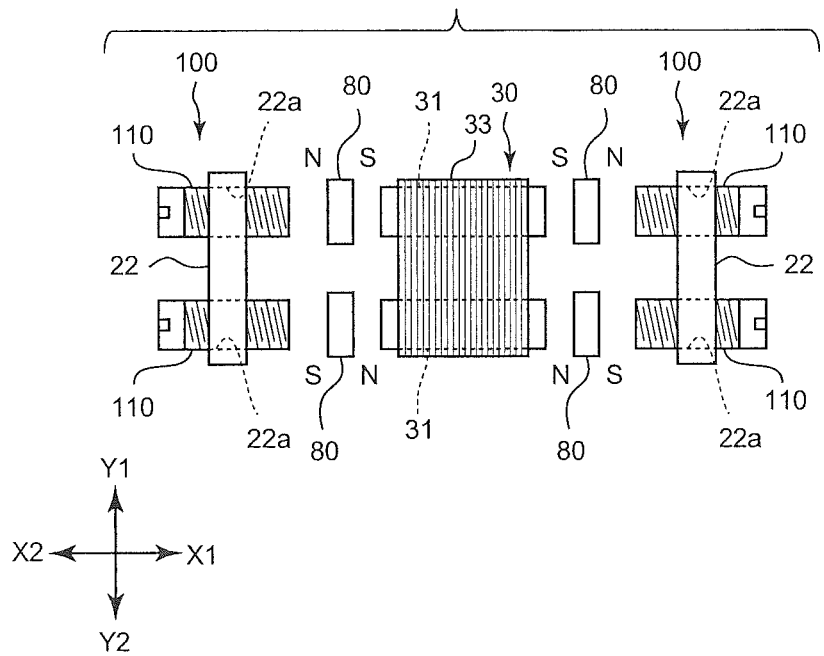
FIG. 14 is a diagram schematically illustrating a disposition of a coil unit and a balance adjusting mechanism according to a modification example of the present invention, and illustrating a structure in which two yokes in total, four magnets in total, four adjusting back yokes in total, and one coil are disposed.

FIG. 14 illustrates a structure in which there exist two yokes 31 in total, four magnets 80 in total, and four adjusting back yokes 110 in total, but only one coil 33 exists. Specifically, in the structure illustrated in FIG. 14, the one coil 33 is wound across the two yokes 31. When the coil unit 30 has such a structure, by setting magnetization directions of the magnets 80 opposing one yoke 31 and magnetization directions of the magnets 80 opposing the other yoke 31 in opposite directions, the first shutter 40A and the second shutter 50A can be driven favorably in opposite directions to each other. Further, by adjusting screwing amounts of the adjusting back yokes 110, the natural frequency of at least one of the first shutter system 400A and the second shutter system 500A can also be adjusted.

Figure 15:
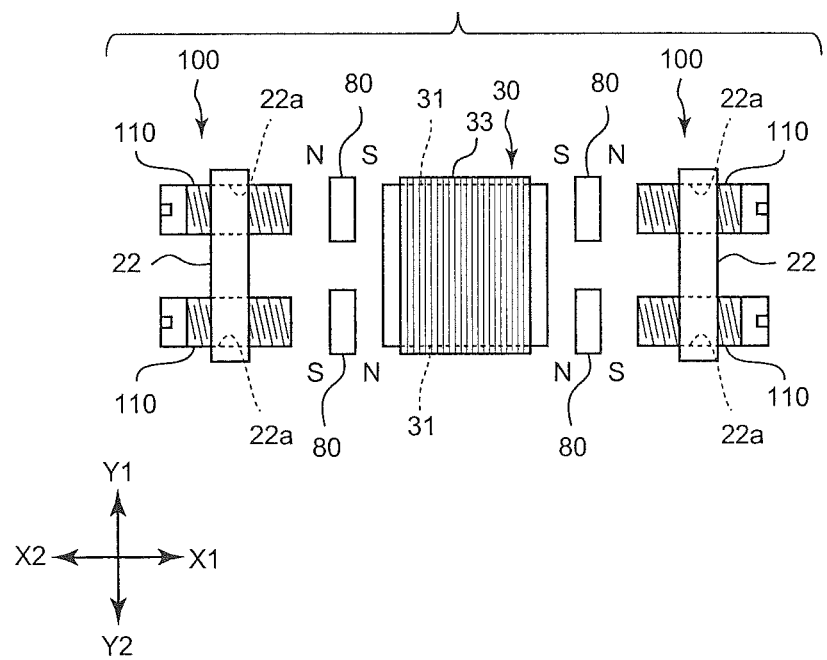
FIG. 15 is a diagram schematically illustrating a disposition of a coil unit and a balance adjusting mechanism according to a modification example of the present invention, and illustrating a structure in which four magnets in total, four adjusting back yokes in total, and one yoke and one coil are disposed.

FIG. 15 illustrates a structure in which there exist four magnets 80 in total and four adjusting back yokes 110 in total, but one yoke 31 and one coil 33 exist. Specifically, in the structure illustrated in FIG. 15, the volume of the yoke 31 is larger than the volumes of the yokes 31 illustrated in FIG. 14, and one coil 33 is wound on such a yoke 31 having a large volume. When the coil unit 30 has such a structure, by setting magnetization directions of the magnets 80 opposing one side of the yoke 31 and magnetization directions of the magnets 80 opposing the other side of the yoke 31 in opposite directions, the first shutter 40A and the second shutter 50A can be driven favorably in opposite directions to each other. Further, by adjusting screwing amounts of the adjusting back yokes 110, the natural frequency of at least one of the first shutter system 400A and the second shutter system 500A can also be adjusted.

Figure 16:
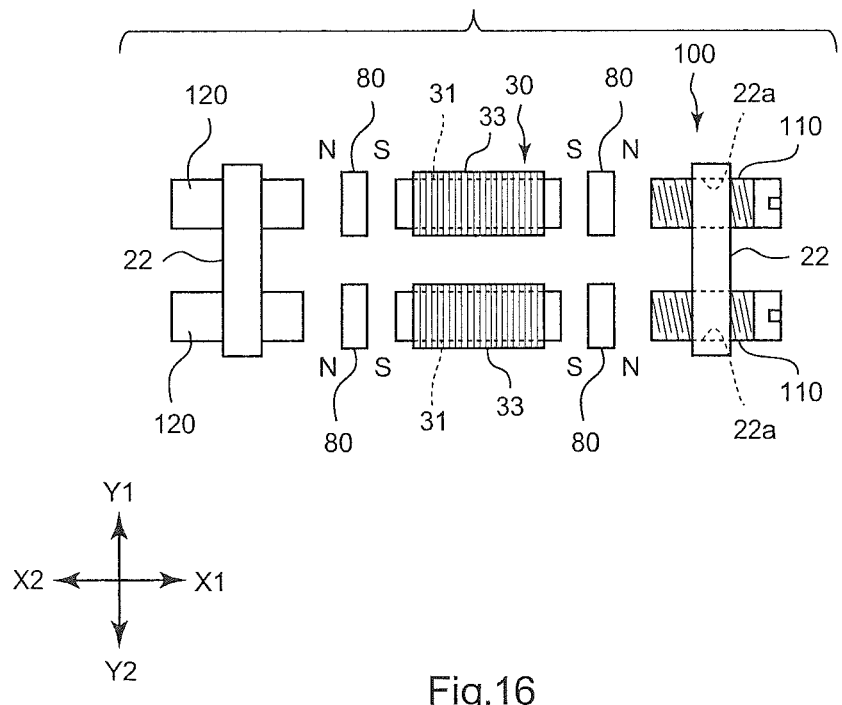
FIG. 16 is a diagram schematically illustrating a disposition of a coil unit and a balance adjusting mechanism according to a modification example of the present invention, and illustrating a structure in which adjusting back yokes are disposed on one side in a longitudinal direction, and fixed back yokes are disposed on the other side in the longitudinal direction.

FIG. 16 illustrates a structure in which there exist four magnets 80 in total and two yokes 31 and two coils 33. However, two adjusting back yokes 110 exist on one side (X1 side) in the longitudinal direction, and fixed back yokes 120 are provided instead of the balance adjusting mechanism 100 on the other side (X2 side) in the longitudinal direction. These fixed back yokes 120 are provided fixedly on a rising part 22, and their gaps to the magnets 80 cannot be changed. When such a structure illustrated in FIG. 16 is employed, the natural frequency of at least one of the first shutter system 400A and the second shutter system 500A can still be adjusted by adjusting screwing amounts of the adjusting back yokes 110.

Figure 17:
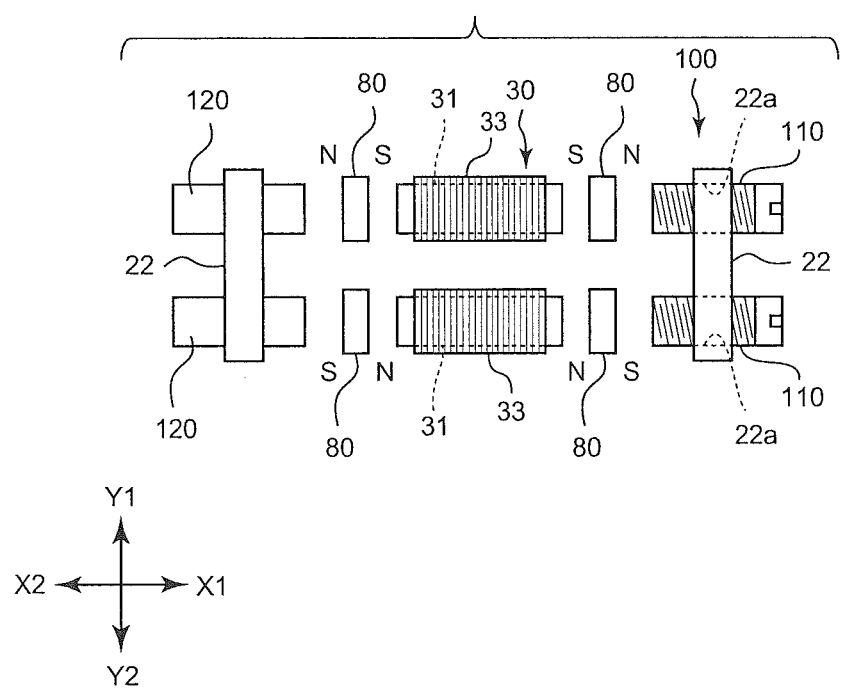
FIG. 17 is a diagram illustrating a structure in which magnetization directions of magnets opposing one yoke and magnetization directions of magnets opposing the other yoke are opposite in magnets of FIG. 16.

Incidentally, as a modification example of FIG. 16, a structure as illustrated in FIG. 17 may be employed. In the structure illustrated in FIG. 16, the magnetization directions of the magnets 80 opposing one yoke 31 and the magnetization directions of the magnets 80 opposing the other yoke 31 are the same. On the other hand, as illustrated in FIG. 17, it may be structured such that the magnetization directions of the magnets 80 opposing one yoke 31 and the magnetization directions of the magnets 80 opposing the other yoke 31 are opposite. In the structure illustrated in FIG. 16, when alternating currents are applied so as to cause the two coils 33 to generate magnetic fields in opposite directions to each other, it is possible to drive the first shutter 40A and the second shutter 50A in opposite directions to each other. On the other hand, in the structure illustrated in FIG. 17, when alternating currents are applied so as to cause the two coils 33 to generate magnetic fields in the same directions as each other, it is possible to drive the first shutter 40A and the second shutter 50A in the opposite directions to each other.

<Another Potential Measuring Device—Part 6>

Figure 18A:
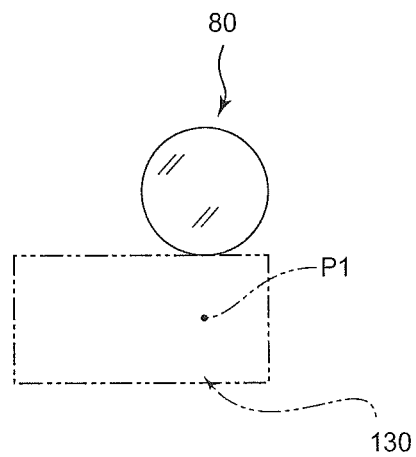
FIGS. 18a-18c are diagrams schematically illustrating a balance adjusting mechanism according to a modification example of the present invention, and illustrating a structure in which a pole face of a magnet is a circular shape, and an opposing plate having a rectangular shape which pivots about a fulcrum relative to the pole face exists.
Figure 18B:
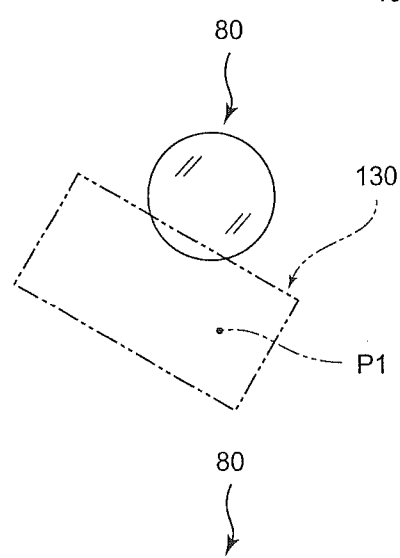
Figure 18C:
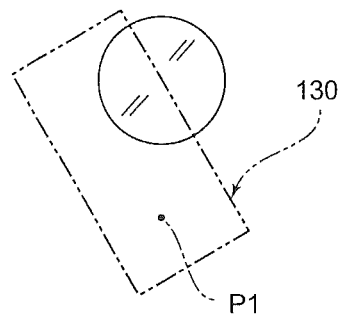
Figure 19A:
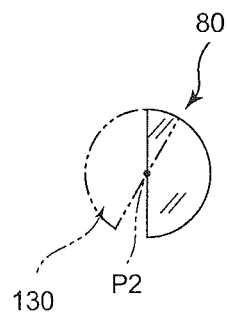
FIGS. 19a-19c are diagrams schematically illustrating a balance adjusting mechanism according to a modification example of the present invention, and illustrating a structure in which a pole face of a magnet is a semicircular shape, and an opposing plate having a semicircular shape which pivots about a fulcrum relative to the pole face exists.
Figure 19B:
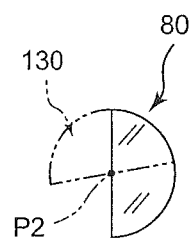
Figure 19C:
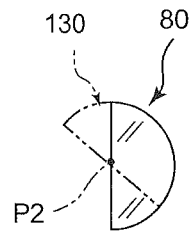
Figure 20A:
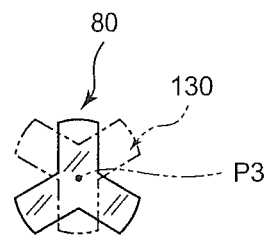
FIGS. 20a-20c are diagrams schematically illustrating a balance adjusting mechanism according to a modification example of the present invention, and illustrating a structure in which three portions of a magnet which have a predetermined width extend toward an outer peripheral side from the center of a pole face at 120-degree intervals.
Figure 20B:
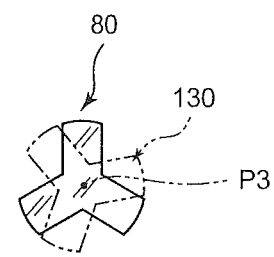
Figure 20C:
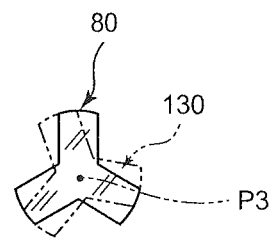

Further, in the above-described potential measuring devices 10A to 10E, structures as illustrated in FIG. 18 to FIG. 20 may be employed as the magnets 80 and the balance adjusting mechanism 100.

FIG. 18 illustrates a structure in which a pole face of a magnet 80 is a circular shape, and an opposing plate 130 pivoting about a fulcrum P1 relative to the pole face exists. This opposing plate 130 corresponds to a back yoke.

By pivoting the opposing plate 130 about the fulcrum P1, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

FIG. 19 illustrates a structure in which, similarly to FIG. 18, an opposing plate 130 opposes a magnet 80. However, in FIG. 19, the pole face of the magnet has a semicircular shape, and the opposing surface of the opposing plate 130 also has a semicircular shape. By pivoting the opposing plate 130 about a fulcrum P2, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

FIG. 20 illustrates a structure in which, similarly to FIG. 18, an opposing plate 130 opposes a magnet 80. However, FIG. 20 illustrates a shape such that three portions of the magnet 80 which have a predetermined width extend toward an outer peripheral side from the center of a pole face at 120-degree intervals (referred to as a three-piece shape). Also in such a structure, by pivoting the opposing plate 130 about a fulcrum P3, an area of the opposing plate 130 that opposes the pole face changes. By this change of the opposing area, the magnetic force between the magnet 80 and the opposing plate 130 changes. Thus, the natural frequency of at least one of the first shutter system 400A and the second shutter system 500A can be adjusted.

Modification Examples

In the foregoing, the potential measuring device according to the embodiment of the present invention and the other potential measuring devices have been described, but the present invention can be modified in various other ways. Such modifications will be described below.

In each potential measuring device 10A to 10E related to the potential measuring device according to the above-described embodiment and the other potential measuring devices, the balance adjusting mechanism 100 is described as one which adjusts natural frequencies of the first shutter system 400A to 400E and the second shutter system 500A to 500E. However, the balance adjusting mechanism 100 may be provided with a function to adjust other than natural frequencies. For example, the balance adjusting mechanism 100 may be one which adjusts the amplitude of at least one of the first shutter system 400A to 400E and the second shutter system 500A to 500E. Thus, the balance adjusting mechanism 100 has a function to adjust an amplitude, and it is possible to increase the change ΔS of the opening area S by this amplitude adjustment, by which good sensitivity of the potential measuring device 10A to 10E may be obtained.

Further, in the potential measuring device according to the above-described embodiment and the other potential measuring devices, the natural frequency of at least one of the first shutter system 400A to 400E and the second shutter system 500A to 500E is adjusted by adjusting the gaps between the magnets 80 and the adjusting back yokes 110. However, a yoke 31 may be provided with the function of the adjusting back yokes 110. Specifically, a mechanism to move the yoke 31 in the X direction or in the Z direction may be provided, and the natural frequency of at least one of the first shutter system 400A to 400E and the second shutter system 500A to 500E may be adjusted by using this mechanism. In this case, the entire yoke 31 may be moved, but it may also be structured such that each of a pair of yoke flange parts 312 moves independently in the X direction or the Y direction relative to a winding part 311.

Further, in the potential measuring device according to the above-described embodiment and the other potential measuring devices, a structure may be employed in which, for example, a coil 33 is provided only on one side in the forward and backward direction (Y direction), but the coil 33 is not provided on the other side. Specifically, similarly to a potential measuring device 10F illustrated in FIG. 21, it may be structured such that the coil 33 is disposed only on a bobbin 32 on the Y1 side, but the coil 33 is not disposed on a bobbin 32 on the Y2 side. Note that in the structure illustrated in FIG. 21, on the X1 side, magnets 80 are disposed so that their magnetization directions are opposite to each other along the Y direction. Further, also on the X2 side, magnets 80 are disposed so that their magnetization directions are opposite to each other along the Y direction. However, on each of the Y1 side and the Y2 side, the magnets are provided so that the same magnetic poles oppose each other in the X direction.

Figure 21:
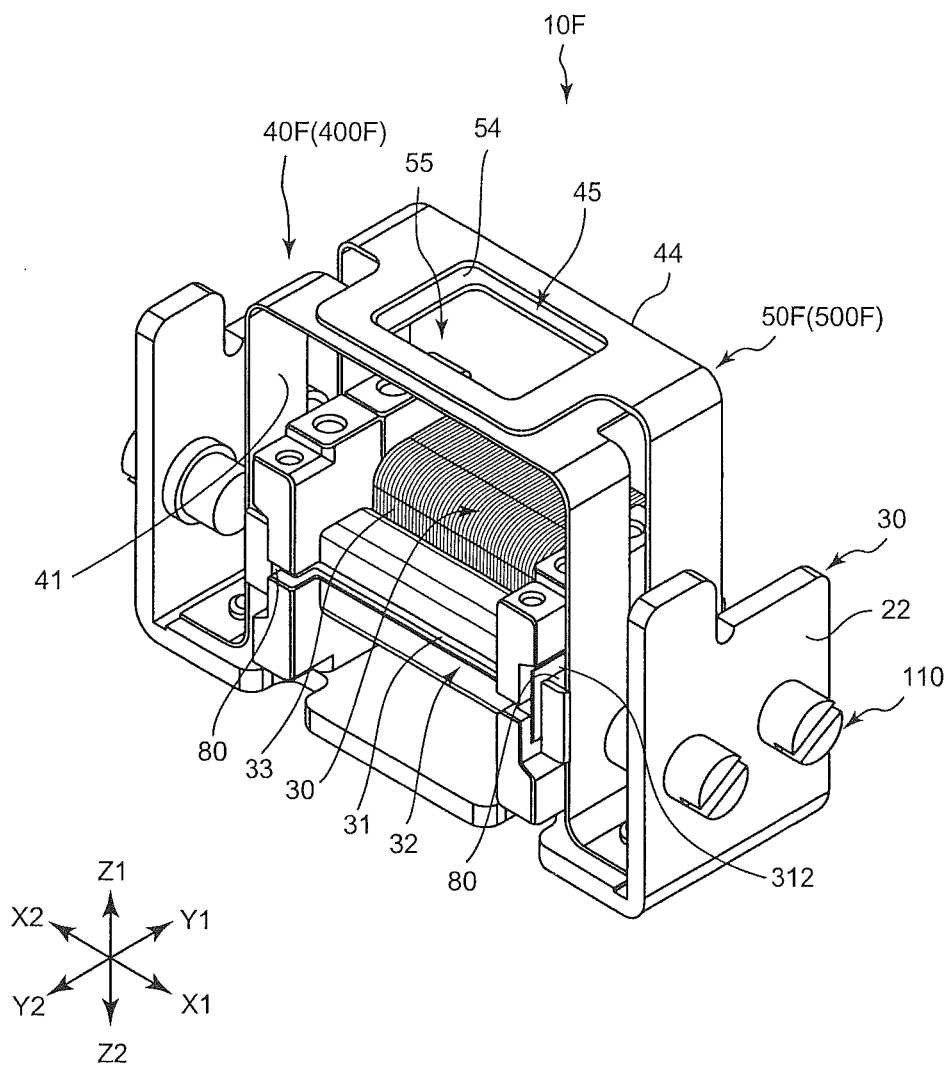
FIG. 21 is a perspective view illustrating a structure according to a modification example of the present invention in which a coil is disposed on one bobbin but a coil is not disposed on the other bobbin.

Also in such a structure illustrated in FIG. 21, a magnet circuit can be formed between the pair of yokes 31, and a first shutter 40F and a second shutter 50F can be favorably driven in opposite directions to each other. Note that in the structure illustrated in FIG. 21, the magnets 80 located on the Y2 side may be ones larger in magnetic force than the magnets 80 located on the Y1 side, thereby balancing the driving force by magnetism in the first shutter 40F and the driving force by magnetism in the second shutter 50F.

Further, in the potential measuring device according to the above-described embodiment and the other potential measuring devices, for example, the potential measuring device 10A to 10E has a pair of coil units 30. In order to prevent such a pair of coil units 30 from magnetically affecting each other, a shield member having the function of a magnetic shield may be disposed between the pair of coil units 30. Note that the shield member may be one structured of, for example, a material similar to the yokes 31 or the adjusting back yokes 110. Further, it may also be structured such that a shield member shields respective magnetic circuits formed by the respective coil units 30.

Further, in the potential measuring device according to the above-described embodiment and the other potential measuring devices, the openings 45, 55 are provided to have a rectangular shape. However, the openings 45, 55 may employ a shape other than the rectangular shape. Examples of such a shape include various shapes such as a circular shape, an elliptic shape, and a polygonal shape.

Further, in the potential measuring device according to the above-described embodiment and the other potential measuring devices, a structure may be employed in which the bobbins 32 are not provided. When the bobbins 32 are not provided, it is a structure in which the coils 33 are disposed directly on the winding parts 311 of the yokes 31. Further, when the bobbins 32 are formed, for example, the bobbins 32 may be formed by mixing a magnetic material in a resin, thereby providing the bobbin 32 with the function of the yoke 31.

Further, in the potential measuring device according to the above-described embodiment and the other potential measuring devices, the printed circuit board 70 and the sensor electrode 60 form a potential measuring device. However, the printed circuit board 70 need not be a component of the potential measuring device. Also the sensor electrode 60 need not be a component of the potential measuring device.

Further, in the potential measuring device according to the above-described embodiment and the other potential measuring devices, the case where the first shutters 40A to 40E and the second shutters 50A to 50E extend from both ends of the leaf spring part 41, 51 is described. However, the first shutter 40A to 40E and the second shutter 50A to 50E are not limited to the structure extending from the both ends of the leaf spring part 41, 51. For example, a structure may be employed in which the first shutter 40A to 40E and the second shutter 50A to 50E extend from an intermediate portion located between one end and the other end of the leaf spring part 41, 51. Further, a structure may be employed in which the leaf spring part 41, 51 extend from an intermediate portion of the first shutter 40A to 40E and the second shutter 50A to 50E.

What is claimed is:

1. A potential measuring device which measures a surface potential of a charged object in a non-contact manner with a sensor disposed to oppose the charged object, the device comprising:
    a first shutter and a second shutter each having a shutter part, which is disposed between the charged object and the sensor and has an opening, and a leaf spring part extending from the shutter parts;
    a magnet attached to the leaf spring part of each of the first shutter and the second shutter;
    a yoke on which a coil is disposed, the coil applying an alternating magnetic field to the magnet of each of the first shutter and the second shutter to cause the shutter part to reciprocate via the leaf spring part; and
    a natural frequency adjusting means for adjusting a natural frequency of at least one of a first shutter system comprising the first shutter and the magnet attached to the first shutter and a second shutter system comprising the second shutter and the magnet attached to the second shutter.

2. The potential measuring device according to claim 1, wherein
    the natural frequency adjusting means comprises an adjusting back yoke disposed on an opposite side of a side of the leaf spring part that opposes the yoke and adjusting a magnetic force between the adjusting back yoke and the magnet, and a support means for supporting the adjusting back yoke.

3. The potential measuring device according to claim 2, wherein
    the natural frequency adjusting means changes a distance between the magnet and the adjusting back yoke.

4. The potential measuring device according to claim 2, wherein
    the natural frequency adjusting means changes an opposing area between the magnet and the adjusting back yoke.

5. The potential measuring device according to claim 2, wherein
    a thread part is formed in an outer periphery of the adjusting back yoke and a screw hole is formed in the support means, a magnetic force between the adjusting back yoke and the magnet is adjusted by adjusting a degree of screwing the thread part of the adjusting back yoke into the screw hole, and by this adjustment of magnetic force the natural frequency of at least one of the first shutter system and the second shutter system is adjusted.

6. The potential measuring device according to claim 2, wherein:
    the support means is provided with a pivot member which is pivotable about a fulcrum, the adjusting back yoke is provided on a portion of the pivot member, which is far from the fulcrum; and
    the adjusting back yoke is provided to be capable of being positioned between a position where the adjusting back yoke opposes the magnet and a position where the adjusting back yoke does not oppose the magnet by pivoting the pivot member.

7. The potential measuring device according to claim 1, wherein:
   the shutter part of the first shutter and the shutter part of the second shutter are disposed to oppose each other in a direction linking the charged object and the sensor; and
   in the opposing disposition, by moving the respective shutter parts of the first shutter and the second shutter by operation of the coil, the shutter parts are capable of being positioned between an open state in which an opening area which is an overlap between the respective openings along an orthogonal direction becomes large and a closed state in which the opening area becomes smaller than in the opening state.

8. A potential measuring device which measures a surface potential of a charged object in a non-contact manner with a sensor disposed to oppose the charged object, the device comprising:

a first shutter and a second shutter each having a shutter part, which is disposed between the charged object and the sensor and has an opening, and a leaf spring part extending from both ends of each of the two shutter parts;

a magnet attached to the leaf spring part of each of the first shutter and the second shutter;

a yoke on which a coil is disposed, the coil applying an alternating magnetic field to the magnet of each of the first shutter and the second shutter to cause the shutter part to reciprocate via the leaf spring part;

an adjusting back yoke disposed on an opposite side of a side of the leaf spring part that opposes the yoke and adjusting a magnetic force between the adjusting back yoke and the magnet; and a magnetic force adjusting means for adjusting a magnetic force between the adjusting back yoke and the magnet.

* * * * *